US010730894B2

(12) United States Patent
Seok et al.

(10) Patent No.: US 10,730,894 B2
(45) Date of Patent: Aug. 4, 2020

(54) METHOD FOR PREPARING INORGANIC/ORGANIC HYBRID PEROVSKITE COMPOUND FILM

(71) Applicant: KOREA RESEARCH INSTITUTE OF CHEMICAL TECHNOLOGY, Daejeon (KR)

(72) Inventors: Sang Il Seok, Daejeon (KR); Jun Hong Noh, Daejeon (KR); Wook Seok Yang, Jeju-si (KR); Jang Won Seo, Seoul (KR); Nam Joong Jeon, Gwangju (KR)

(73) Assignee: Korean Research Institute of Chemical Technology, Daejeon (KR)

( * ) Notice: Subject to any disclaimer, the term of this patent is extended or adjusted under 35 U.S.C. 154(b) by 294 days.

(21) Appl. No.: 15/501,346

(22) PCT Filed: Aug. 3, 2015

(86) PCT No.: PCT/KR2015/008103
§ 371 (c)(1),
(2) Date: Feb. 2, 2017

(87) PCT Pub. No.: WO2016/021900
PCT Pub. Date: Feb. 11, 2016

(65) Prior Publication Data
US 2018/0208611 A1 Jul. 26, 2018

(30) Foreign Application Priority Data

Aug. 5, 2014 (KR) .................. 10-2014-0100626

(51) Int. Cl.
*C07F 7/24* (2006.01)
*H01G 9/20* (2006.01)
*H01L 51/00* (2006.01)
*H01L 51/42* (2006.01)

(52) U.S. Cl.
CPC .............. *C07F 7/24* (2013.01); *H01G 9/2009* (2013.01); *H01L 51/0077* (2013.01); *H01L 51/4226* (2013.01); *Y02E 10/549* (2013.01)

(58) Field of Classification Search
None
See application file for complete search history.

(56) References Cited

U.S. PATENT DOCUMENTS 6,150,536 A * 11/2000 Chondroudis ....... C07D 333/18
117/68
2012/0279566 A1 11/2012 Bruder et al.

FOREIGN PATENT DOCUMENTS

CN 103346018 A 10/2013
KR 1020140010971 A 1/2014

OTHER PUBLICATIONS

Jeon et al., Nature Materials, 2014, vol. 13, pp. 897-903. (Year: 2014).*
Jung et al, Chem. Soc. Rev., 2019, 48, 2011. (Year: 2011).*
Yongzhen Wu, et al; "Retarding the crystallization of $PbI_2$ for highly reproducible planar-structured perovskite solar cells via sequential deposition", Energy Environmental & Science, 7(9), Jul. 2014; 5 pages.
Korean Office Action dated May 21, 2018; Appln. No. 10-2017-7002222.
The First Chinese Office Action dated Aug. 31, 2017; Appln. No. 201580041999.7.
Qi Chen et al. "Planar Heterojunction Perovskite Solar Cells via Vapor-Assisted Solution Process", Journal of The American Chemical Society, vol. 136; pp. 622-625; Published Dec. 20, 2013.
Nam Joong Jean, et al; "Solvent engineering for high-performance inorganic-organic hybrid perovskite solar cells", Nature Materials, vol. 13, Sep. 2014; pp. 897-903; Published online Jul. 6, 2014.
International Search Report dated Nov. 10, 2015; PCT/KR2015/008103.

* cited by examiner

*Primary Examiner* — Clinton A Brooks
*Assistant Examiner* — Kofi Adzamli

(57) ABSTRACT

The present invention relates to a method for preparing an inorganic/organic hybrid perovskite compound film, and a structure for a solar cell and, specifically, a method for preparing an inorganic/organic hybrid perovskite compound film, according to one embodiment of the present invention, can comprise the steps of: a) forming, on a substrate layer, an adduct layer containing an adduct of halogenated metal and guest molecule; and b) preparing an inorganic/organic hybrid perovskite compound film by reacting the adduct layer and an organic halide.

9 Claims, 5 Drawing Sheets

METHOD FOR PREPARING INORGANIC/ORGANIC HYBRID PEROVSKITE COMPOUND FILM

TECHNICAL FIELD

The present invention relates to a method for preparing an inorganic/organic hybrid perovskite compound film, and more particularly, to a method for preparing an inorganic/organic hybrid perovskite compound film capable of preparing a very thick inorganic/organic hybrid perovskite compound film, capable of preparing a coarse crystal grain film, and capable of preparing a film having a dense and smooth surface, and being free from thermal damage of a substrate since an extremely fast and uniform reaction is generated at the time of preparing the inorganic/organic hybrid perovskite compound film.

BACKGROUND ART

An inorganic/organic hybrid perovskite compound is also referred to as an organometal halide perovskite compound or an organometal halide having a perovskite structure. The inorganic/organic hybrid perovskite compound is a substance represented by Chemical Formula of $AMX_3$ including an organic cation (A), a metal cation (M) and a halogen anion (X), and having a perovskite structure. In detail, the inorganic/organic hybrid perovskite compound represented by Chemical Formula of $AMX_3$ has a form in which the organic cation (A) is positioned in the middle of a three-dimensional network with a corner-sharing $MX_6$ octahedron.

An inorganic/organic hybrid perovskite compound is self-assembled and crystallized, which is possible to perform a low temperature solution process. However, there is a serious problem in actually producing a thin film having a dense and flat surface due to rapid crystallization and difficulty in controlling self-assembling properties.

In order to solve this problem, a sequential deposition method in which films deposited with a metal halide ($MX_2$) and an organic halide (AX) are formed, and these two films react to form an inorganic/organic hybrid perovskite compound film has been proposed (Chem. Mater. 13, 3283 (2001), Nature 499, 316 (2013)).

However, first, such a sequential deposition method has insufficient solubility of the metal halide ($MX_2$) represented by $PbI_2$, and thus, there is a problem in preparing a thick metal halide film. Second, even though a thick film having a thickness of 200 nm or more is obtained by applying the metal halide ($MX_2$) solution while maintaining it at a high temperature, the reaction with AX is not sufficiently performed due to the thickness. Third, in the case of a film prepared by the conventional sequential deposition method, a large volume change occurs in the reaction of the two films, and thus, surface roughness of an inorganic/organic hybrid perovskite compound film to be finally obtained is excessively large. In particular, the roughness of the film surface may be a decisive factor in reducing a performance index when a solar cell using the inorganic/organic hybrid perovskite compound film is prepared.

DISCLOSURE

Technical Problem

An object of the present invention is to provide a method for preparing an inorganic/organic hybrid perovskite compound film. In detail, an object of the present invention is to provide a method for preparing a thick inorganic/organic hybrid perovskite compound film in which it is possible to prepare an inorganic/organic hybrid perovskite compound film, to prepare a film of coarse crystal grains, and to prepare a film having a dense and smooth surface, and a substrate is free from thermal damage.

Another object of the present invention is to provide a structure for a solar cell capable of preparing a thick and dense light absorber film composed of coarse light absorber crystal grains and having a smooth surface due to significantly low surface roughness, wherein there is almost no volume change occurring during reaction.

Still another object of the present invention is to provide an inorganic/organic hybrid perovskite compound film having a dense and smooth surface, and composed of coarse crystal grains.

Another object of the present invention is to provide a solar cell including the inorganic/organic hybrid perovskite compound film as a light absorbing layer, and a manufacturing method thereof.

Technical Solution

In one general aspect, a method for preparing an inorganic/organic hybrid perovskite compound film includes: a) forming a precursor film containing an adduct of halogenated metal and guest molecule (an adduct layer) on a substrate layer; and b) reacting the precursor film with an organic halide to prepare an inorganic/organic hybrid perovskite compound film.

In step b), the precursor film may be converted to the inorganic/organic hybrid perovskite compound film, by an intramolecular exchange reaction between the guest molecule contained in the precursor film and the organic halide.

The guest molecule may be a solvent that dissolves a halogenated metal of the adduct of halogenated metal and guest molecule, or a hydrogen halide.

The guest molecule may be a material satisfying the following Relational Equation 1:

$$0 \leq \frac{|t_p - t_0|}{t_0} \leq 0.2 \quad \text{(Relational Equation 1)}$$

in Relational Equation 1, $t_0$ is a thickness of the precursor film, and $t_p$ is a thickness of the inorganic/organic hybrid perovskite compound film formed from the precursor film.

Step a) may include applying a first solution containing the adduct of halogenated metal and guest molecule, or a second solution containing a halogenated metal and a guest molecule to a substrate layer.

Step b) may include applying a third solution containing the organic halide onto the precursor film.

The adduct of halogenated metal and guest molecule may be represented by Chemical Formula 1 below:

$$MX_2(GM)_n \quad \text{(Chemical Formula 1)}$$

in Chemical Formula 1, M is a divalent metal cation, X is one or two or more halogen anions selected from $Cl^-$, $Br^-$, $F^-$, and $I^-$, GM is dimethylsulfoxide (DMSO) as a guest molecule, and n is a real number of 0.5 to 50.

The substrate layer may include a charge transport layer which is an electron transport layer or a hole transport layer, the charge transport layer having a porous structure or a dense structure.

The organic halide may satisfy the following Chemical Formula 2:

$$AX \qquad \text{(Chemical Formula 2)}$$

in Chemical Formula 2, A is one or two organic cations selected from ammonium group cations and amidinium group cations, and X is one or two or more halogen anions selected from Cl⁻, Br⁻, F⁻, and I⁻.

The method may further include, after step b), step c) annealing the precursor film that reacts with the organic halide.

In another general aspect, a hybridized substrate for a solar cell includes a precursor film containing an adduct of halogenated metal and guest molecule (an adduct layer) on a substrate layer. Specifically, the hybridized substrate for a solar cell may include a substrate layer, and a precursor film containing an adduct of halogenated metal and guest molecule (an adduct layer), positioned on the substrate layer.

The precursor film may contact an organic halide represented by Chemical Formula 2 below to be converted to an inorganic/organic hybrid perovskite compound film, by an intramolecular exchange reaction between the organic halide and the guest molecule of the precursor film:

$$AX \qquad \text{(Chemical Formula 2)}$$

in Chemical Formula 2, A is one or two organic cations selected from ammonium group cations and amidinium group cations, and X is one or two or more halogen anions selected from Cl⁻, Br⁻, F⁻, and I⁻.

When the precursor film is converted to the inorganic/organic hybrid perovskite compound film, a thickness change may be 20% or less based on a thickness of the precursor film.

The guest molecule may be a solvent that dissolves a halogenated metal, or a hydrogen halide.

The substrate layer may include a charge transport layer which is an electron transport layer or a hole transport layer, the charge transport layer having a porous structure or a dense structure.

Advantageous Effects

According to the preparation method according to an exemplary embodiment of the present invention, it is possible to prepare an inorganic/organic perovskite compound film by reacting a precursor film containing an adduct of halogenated metal and guest molecule with an organic halide. According to the preparation method according to an exemplary embodiment of the present invention, even though the precursor film is a thick film, a reaction between the organic halide and the precursor film is generated very quickly, thereby preparing a thick film, and thereby preparing a dense film composed of extremely coarse crystal grains. Further, as the reaction is generated very rapidly even at an extremely low temperature reaching room temperature, a substrate layer positioned under the precursor film may be free from thermal damage. Further, since there is almost no volume change occurring when the precursor film is converted to the inorganic/organic perovskite compound film, it is possible to prepare a high quality inorganic/organic perovskite compound film of which a surface is extremely flat. In addition, the high quality inorganic/organic perovskite compound film is able to be prepared by an extremely simple and stable method that includes formation of the precursor film by solution application and reaction of the precursor film with a metal halide. Accordingly, the film is able to be prepared by a low cost process, and film quality is not sensitively changed according to change in process variables. Therefore, it is possible to prepare a large-area inorganic/organic perovskite compound film in which quality is easily maintained and homogeneous property is achieved.

A structure for a solar cell according to an exemplary embodiment of the present invention includes the precursor film containing the adduct of halogenated metal and guest molecule, positioned on the substrate layer, thereby being converted to the inorganic/organic perovskite compound film which is a light absorber film, by the reaction with the organic halide. The structure for a solar cell according to an embodiment of the present invention may be converted to a light absorber film (inorganic/organic perovskite compound film) having a thick film form, and may be converted to a dense light absorber film (inorganic/organic perovskite compound film) composed of extremely coarse crystal grains. Further, since there is almost no volume change when the precursor film is converted to the inorganic/organic perovskite compound film, it is possible to be converted to a high quality light absorber film (inorganic/organic perovskite compound film) of which a surface is extremely flat. In addition, the precursor film is able to be very quickly converted to the light absorber film (inorganic/organic perovskite compound film) even at an extremely low temperature reaching room temperature, and thus, the substrate layer may be free from thermal damage. Therefore, the film of the present invention is particularly suitable for a flexible solar cell.

BEST MODE

Figure 1:
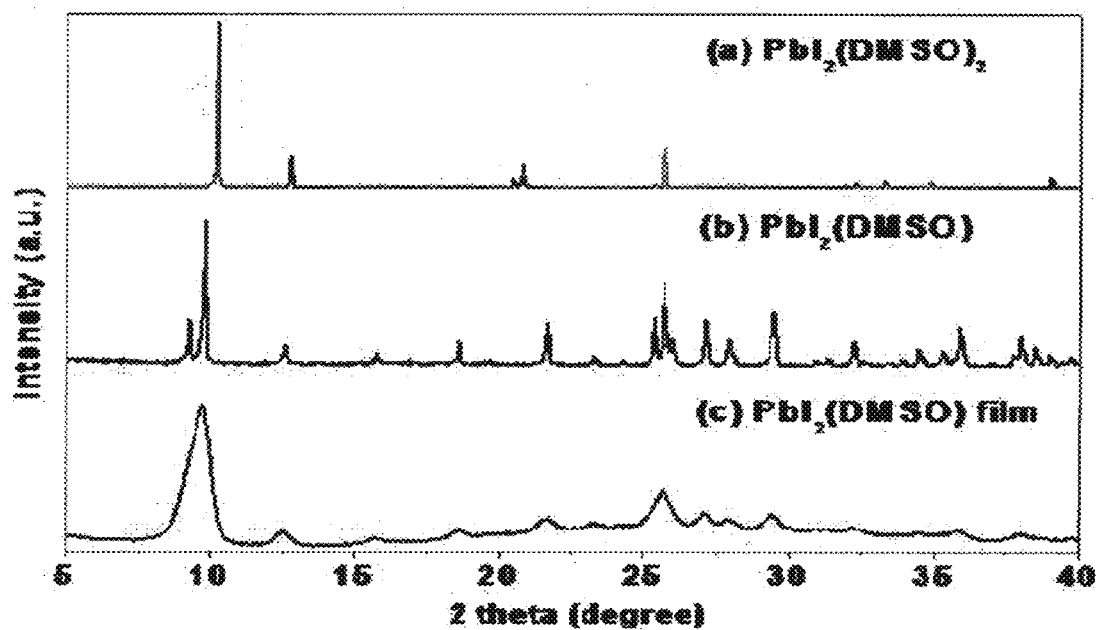
FIG. 1 shows an X-ray diffraction analysis result (FIG. 1(a)) of a precursor prepared in Preparation Example 1, an X-ray diffraction analysis result of a precursor material prepared in Preparation Example 2 (FIG. 1(b)), and an X-ray diffraction analysis result (FIG. 1(c)) of a film (precursor film) prepared by spin-coating an adduct solution of PbI₂ (DMSO) in Example 1.

Hereinafter, embodiments of the present invention will be described in detail with reference to the accompanying drawings. The drawings to be described below are provided by way of example so that the idea of the present invention can be sufficiently transferred to those skilled in the art to which the present invention pertains. Therefore, the present invention may be implemented in many different forms, without being limited to the drawings to be described below. The drawings below may be exaggerated in order to specify the spirit of the present invention. Here, unless technical and scientific terms used herein are defined otherwise, they have meanings understood by those skilled in the art to which the present invention pertains. Description of known functions and components that may unnecessarily obscure the gist of the present invention will be omitted from the following description and the accompanying drawings.

The present applicant made significant effort for a long period of time to prepare an inorganic/organic hybrid perovskite compound film having no limitation in a thickness thereof, composed of very coarse crystal grains, being dense, and having a significantly smooth (low roughness) surface while maintaining a solution application process as it is, which is the biggest advantage of an inorganic/organic hybrid perovskite compound. As a result, the present applicant found that a precursor film containing an adduct of halogenated metal and guest molecule (an adduct layer) was formed, and the precursor film was converted to an inorganic/organic hybrid perovskite compound film, by an intramolecular exchange reaction between the guest molecule of the adduct of halogenated metal and guest molecule and an organic halide, thereby achieving the above-described purpose, deepened this discovery, and filed the present invention.

In the present invention, the inorganic/organic hybrid perovskite compound (inorganic-organic hybrid perovskite compound) may mean a compound having a perovskite structure and including a monovalent organic cation (hereinafter, referred to as A), a divalent metal cation (hereinafter, referred to as M), and a halogen anion (hereinafter, referred to as X).

In detail, the inorganic/organic hybrid perovskite compound may be a compound represented by Chemical Formula of $AMX_3$, and having a structure in which A is positioned in the middle of a three-dimensional network with a corner-sharing $MX_6$ octahedron.

In other words, based on a unit cell, the inorganic/organic hybrid perovskite compound may have a structure in which M is positioned in the center of the unit cell in the perovskite structure, X is positioned in the center of each side of the unit cell, and forms an octahedron structure around the M, and A is positioned at each corner of the unit cell.

The above described inorganic/organic perovskite compound may also be referred to as an organic cation metal halide perovskite compound or an organic cation metal halide having a perovskite structure.

In the present invention, the halogenated metal means a compound of a divalent metal cation and a halogen anion composing an inorganic/organic hybrid perovskite compound to be produced, and may be represented by Chemical Formula $MX_2$. Here, the halogenated metal may also be referred to as a metal halide compound.

In the present invention, the adduct of halogenated metal and guest molecule may be a compound including the guest molecule together with a divalent metal cation and a halogen anion composing the inorganic/organic hybrid perovskite compound to be prepared. In detail, the adduct of halogenated metal and guest molecule may be a compound in which the halogenated metal ($MX_2$) of the divalent metal cation and the halogen anion composing the inorganic/organic hybrid perovskite compound, and the guest molecule are non-covalently bonded. As a specific example, the adduct of halogenated metal and guest molecule may be a compound in which the halogenated metal and the guest molecule are bonded by van der Waals force. Structurally, the adduct of halogenated metal and guest molecule may have a structure in which the guest molecule is intercalated between layers of the halogenated metal having a layered structure. The adduct of halogenated metal and guest molecule described above may also be referred to as a halogenated metal precursor material. This is because when the adduct of halogenated metal and guest molecule is reacted with the organic halide, the guest molecule is removed through molecular exchange (substitution), and the halogenated metal is able to be provided.

In the present invention, the guest molecule includes a single molecule to a polymer.

In the present invention, the organic halide means a compound of a monovalent organic cation and a halogen anion composing an inorganic/organic hybrid perovskite compound to be produced, and may be represented by Chemical Formula AX.

In the present invention, the precursor film may be a film containing the adduct of halogenated metal and guest molecule. In addition, the precursor film may be used for preparing the inorganic/organic hybrid perovskite compound film. In the case of a solar cell in which the inorganic/organic hybrid perovskite compound is provided as a light absorber, the precursor film may be used for preparing a solar cell light absorber film.

In an exemplary embodiment of the present invention, the precursor film may include a film containing the adduct of halogenated metal and guest molecule instead of a film of the halogenated metal itself, wherein the precursor film may be a crystalline film. Specifically, the precursor film may be a film composed of the adduct of halogenated metal and guest molecule, and the crystalline film of the adduct of halogenated metal and guest molecule. In addition, the precursor film may be a film that is converted to the inorganic/organic hybrid perovskite compound film by exchange between the guest molecule contained in the adduct of halogenated metal and guest molecule, and the organic halide.

In detail, the guest molecule bonded with the halogenated metal may be removed from the precursor film, and at the same time, the organic halide diffusively introduced into the precursor film may react and be bonded with the halogenated metal, thereby forming the inorganic/organic hybrid perovskite compound.

The guest molecule of the adduct of halogenated metal and guest molecule is extremely easily removed when the inorganic/organic hybrid perovskite compound (hereinafter, referred to as a perovskite compound) is formed, and the perovskite structure in which A is positioned in the middle of a three-dimensional network with a corner-sharing $MX_6$ octahedron is formed without interference, and a volume change (volume difference between a precursor material of the metal halide and the perovskite compound) occurring at the time of conversion of the precursor film to the perovskite compound may be suppressed, and migration (diffusion) of the organic halide may be improved.

Specifically, the guest molecule of the adduct of halogenated metal and guest molecule may be a material satisfying the following Relational Equation 1:

$$0 \leq \frac{|t_p - t_0|}{t_0} \leq 0.2 \qquad \text{(Relational Equation 1)}$$

in Relational Equation 1, to is a thickness of the precursor film, and $t_p$ is a thickness of the perovskite compound film converted from the precursor film.

More specifically, the guest molecule of the adduct of halogenated metal and guest molecule may be a material satisfying the following Relational Equation 2:

$$0 \leq \frac{|t_p - t_0|}{t_0} \leq 0.15 \qquad \text{(Relational Equation 2)}$$

in Relational Equation 2, to is a thickness of the precursor film, and $t_p$ is a thickness of the perovskite compound film converted from the precursor film.

As an example, the guest molecule of the adduct of halogenated metal and guest molecule may be a material in which a thickness change of a perovskite compound film (thickness=$t_p$) satisfies Relational Equation 1, the perovskite compound film being obtained by applying a solution containing the adduct of halogenated metal and guest molecule itself or containing the halogenated metal and the guest molecule on the substrate layer, thereby forming a precursor film having a thickness of to, and then, applying a solution containing an organic halide to the precursor film. Here, in a step of applying the solution containing the organic halide to the precursor film at substantially room temperature, the precursor film may be converted to the perovskite compound film.

In a conventional sequential deposition method, a film deposited with a metal halide ($MX_2$) and a film deposited with an organic halide (AX) are formed, and these two films are heat-treated to form an inorganic/organic hybrid perovskite compound film. That is, in the conventional sequential deposition method, a reaction between the metal halide and the organic halide is finally generated by heat treatment, thereby forming the perovskite compound film. Accordingly, in view of clarifying the constitution of the present invention as compared to the conventional preparation method, the thickness ($t_p$) of the perovskite compound film of Relational Equation 1 or Relational Equation 2 may be a thickness ($t_p$) of a perovskite compound film obtained by applying the solution containing the organic halide to the precursor film, followed by heat treatment. At this time, in the step of applying the solution containing the organic halide, as the precursor film is converted to the perovskite compound film, $T_p$ is not changed depending on whether the heat treatment (annealing) for coarsening of crystals is performed.

As a practical example, the guest molecule of the adduct of halogenated metal and guest molecule may be a material in which a thickness change of a perovskite compound film (thickness=$t_p$) satisfies Relational Equation 1, and preferably, Relational Equation 2, the perovskite compound film being obtained by applying a solution containing the adduct of halogenated metal and guest molecule to a flat substrate, thereby forming a precursor film having a thickness of 100 to 600 nm, and applying a solution containing $CH(NH_2)_2I$.

As another practical example, the guest molecule of the adduct of halogenated metal and guest molecule may be a material in which a thickness change of a perovskite compound film satisfies Relational Equation 1, and preferably, Relational Equation 2, the perovskite compound film being obtained by applying a solution containing the adduct of halogenated metal and guest molecule to a flat substrate, thereby forming a precursor film having a thickness of 100 to 600 nm, applying a solution containing $CH(NH_2)_2I$, and performing heat treatment at 100 to 150° C. for 20 to 30 minutes.

The adduct of halogenated metal and guest molecule may be a compound in which the halogenated metal and the guest molecule are chemically bonded to each other, with the above-described Relational Equation 1, preferably, together with the above-described Relational Equation 2, or independently of the above-described Relational Equation 1 and Relational Equation 2. Here, the chemical bond between the halogenated metal and the guest molecule may be a covalent bond or a non-covalent bond, and preferably a non-covalent bond. The non-covalent bond may include ionic bonds, coordination bonds, hydrogen bonds or bonds by van der Waals force.

As a specific example, the adduct of halogenated metal and guest molecule may be a compound in which the halogenated metal is chemically bonded with the guest molecule including oxygen, nitrogen, or oxygen and nitrogen which include non-covalent electron pairs. As another specific example, the adduct of halogenated metal and guest molecule may be a compound in which the halogenated metal and a hydrogen compound including hydrogen are chemically bonded to each other. Thereby, the precursor film may be very rapidly converted to the perovskite compound film by a low-temperature reaction including room temperature between the precursor film and the organic halide.

When the adduct of halogenated metal and guest molecule is the compound in which the guest molecule including oxygen, nitrogen, or oxygen and nitrogen is non-covalently bonded with the halogenated metal, or the compound in which the hydrogen compound is bonded with the halogenated metal at the time of reacting a film containing the adduct of halogenated metal and guest molecule with the organic halide, a bond between the organic halide and the halogenated metal is stronger and more stable than a bond between the halogenated metal and the guest molecule. Accordingly, when the adduct of halogenated metal and guest molecule is the compound in which the guest molecule including oxygen, nitrogen, or oxygen and nitrogen is non-covalently bonded with the halogenated metal, or the compound in which the hydrogen compound is bonded with the halogenated metal, the adduct of halogenated metal and guest molecule may be converted to a perovskite compound, which is a thermodynamically more stable compound, by the intramolecular exchange reaction between the guest molecule and the organic halide. That is, when contacting the organic halide, the adduct of halogenated metal and guest molecule which is meta-stable may be converted to a stable perovskite compound.

The guest molecule that is intercalated between the layers of the halogenated metal having a layered structure or is bonded with the halogenated metal to be capable of forming a crystal phase different from the halogenated metal may be a molecule including oxygen, nitrogen, or oxygen and nitrogen which include non-covalent electron pairs, or may be a hydrogen compound. Further, the guest molecule may be a single molecule to a polymer. Here, a diffraction peak in X-ray diffraction pattern may appear when an analyte is a crystalline material having a long-range ordering, and thus, the formation of the crystal phase may mean that there is a diffraction peak as a diffraction result using a conventional X-ray diffraction pattern. In addition, the crystal phase different from the halogenated metal means that there are at least one or more peaks which are different from X-ray diffraction pattern of the halogenated metal itself. Here, the X-ray diffraction pattern may be a pattern measured on a powder sample by a θ-2θ method using a Cu Kα line.

As a specific example, in the adduct of halogenated metal and guest molecule, the guest molecule may be any material as long as it is capable of forming a compound by non-covalent bonding with the halogenated metal, such as dimethylsulfoxide (DMSO), N-methyl-2-pyrrolidone (NMP), 2,2'-bipyridine, 4,4'-bipyridine, 4,4'-bipyridine-N,N'-dioxide, pyrazine, 1,10-phenanthroline, 2-methylpyridine or poly(ethylene oxide), etc.

As a specific example, in the adduct of halogenated metal and guest molecule, the quest molecule may be a hydrogen compound, and the hydrogen compound may be a compound including hydrogen and a chalcogen element. The compound including hydrogen and a chalcogen element may be specifically a hydrogen halide. The hydrogen halide may include a covalent compound in which hydrogen is bonded to at least one chalcogen selected from fluorine (F), chlorine (Cl), bromine (Br) and iodine (I). More specifically, the hydrogen halide may include one or two or more selected from hydrogen fluoride (HF), hydrogen chloride (HCl), hydrogen bromide (HBr), and hydrogen iodide (HI).

Preferably, the guest molecule of the adduct of halogenated metal and guest molecule may be a single molecule in view of easy site exchange with the organic halide and prevention of the volume change at the time of the conversion to the perovskite compound film.

More preferably, the adduct of halogenated metal and guest molecule is preferably a solvate including the halogenated metal and a solvent that dissolves the halogenated metal, and independently, a compound including the halogenated metal and hydrogen halide which is diffused very rapidly, so that the guest molecule intercalated between the layers of the halogenated metal having a layered structure is able to be easily diffused and removed, and exchanged with the organic halide at a low temperature including room temperature.

The solvate may mean a higher order compound that is formed between molecules or ions of a solute (halogenated metal), and molecules or ions of a solvent. When the adduct of halogenated metal and guest molecule is a solvate, it is possible to diffusively remove the guest molecule easily and rapidly due to strong volatility of the solvent, and simultaneously to generate rapid and easy site exchange with the organic halide. Accordingly, the perovskite compound film having a thick film form may be prepared only by applying a solution containing an organic halide to the precursor film at a low temperature including room temperature.

When the adduct of halogenated metal and guest molecule is the solvate, the adduct of halogenated metal and guest molecule may be a compound in which the halogenated metal is non-covalently bonded with the guest molecule which is the solvent of the halogenated metal. As a specific example, the guest molecule may be a solvent including oxygen, nitrogen, or oxygen and nitrogen, and dissolving the halogenated metal.

As a specific example, the adduct of halogenated metal and guest molecule may satisfy Chemical Formula 1 below:

  (Chemical Formula 1)

in Chemical Formula 1, M is a divalent metal cation, X is one or two or more halogen anions selected from Cl⁻, Br⁻, F⁻, and I⁻, GM is dimethylsulfoxide (DMSO) as a guest molecule, and n is a real number of 0.5 to 50. In view of prevention of the volume change which satisfies Relational Equation 1, n in Chemical Formula 1 may be 0.5 to 5, specifically n may be 0.5 to 2, and more specifically, n may be 0.5 to 1.5.

In the $MX_2$ in Chemical Formula 1, the M may be one or two or more metal ions selected from $Cu^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X may be one or two or more selected from $I^-$, $Br^-$, $F^-$, and $Cl^-$.

A solvate in which the halogenated metal is non-covalently bonded with a molecule of dimethylsulfoxide which is a solvent that dissolves the halogenated metal, may have a structure in which the molecule of dimethylsulfoxide is intercalated between layers of the halogenated metal ($MX_2$) having a layered structure.

According to this structure, it is possible to have extremely excellent reactivity with the organic halide at room temperature, and thus, a thick perovskite compound film may be prepared in a short time, and a perovskite compound film composed of extremely coarse crystal grain may be prepared.

Further, in the case of the halogenated metal, there is limitation in a thickness when a film is formed by applying a solution due to limitation of solubility thereof. However, according to Chemical Formula 1, when the adduct of halogenated metal and guest molecule is the solvate including the halogenated metal and dimethylsulfoxide that dissolves the halogenated metal, the adduct has very high solubility as compared to the halogenated metal itself, and thus, it is possible to prepare a very thick precursor film by a single applying process.

As described above, when the adduct of halogenated metal and guest molecule is a solvate including Chemical Formula 1, in the reaction of the precursor film for forming the perovskite film, the guest molecule may be extremely easily removed, and simultaneously, the organic halide may be introduced while simultaneously removing the guest molecule. The organic halide may be rapidly and easily introduced (diffused), and thus, it is possible to prepare a dense film composed of a perovskite compound with extremely coarse crystal grains, and further, to prepare a very thick perovskite compound film by rapid and easy diffusion of the organic halide.

As a specific example, when the adduct of halogenated metal and guest molecule is the solvate including Chemical Formula 1, it is possible to prepare the perovskite compound film having a thickness of 300 nm or more, and to prepare a perovskite compound film which is a dense film composed of coarse crystal grains having a perovskite compound crystal grain size of 1 μm or more.

Also, when the adduct of halogenated metal and guest molecule is the solvate including Chemical Formula 1, the volume change defined by Relational Equation 1 is 0.15 or less, and occurrence of volume change at the time of conversion to the perovskite compound film may be remarkably suppressed.

According to technological development direction including slimness and lightness and low power, electronic devices, light emitting devices, and display devices are based on various deposition thin film structures.

Accordingly, when the perovskite film has a large surface unevenness, there is limitation in utilization since implementation of a deposition thin film structure itself is significantly difficult. Further, as suggested in Korean Patent Laid-Open Publication Nos. 10-2014-0035284 and 10-2014-0035285 by the present applicant, surface roughness of the perovskite compound layer, which is a photoactive layer, significantly affects power generation efficiency of a solar cell.

When a perovskite compound thin film is produced by depositing a halogenated metal thin film and an organic halide thin film, and reacting these two thin films according to the Related Art, there is limitation in a thickness of the film that is able to be prepared, and further, a volume difference before and after the reaction is very large, and thus, crystal grains of the perovskite compound are irregularly projected and/or recessed, resulting in a very rough surface of the thin film.

However, in the preparation method according to an exemplary embodiment of the present invention, the precursor film may be converted to the inorganic/organic hybrid perovskite compound film, by an intramolecular exchange reaction between the guest molecule contained in the precursor film and the organic halide. That is, as the organic halide is substituted and positioned at a site of the guest molecule in a state in which the adduct of halogenated metal and guest molecule already forms a crystalline compound between the halogenated metal and the guest molecule, a volume difference before and after the reaction (expansion or contraction based on the precursor film) is remarkably suppressed by the guest molecule of the adduct of halogenated metal and guest molecule, and thus, the surface roughness is prevented from increasing and a perovskite compound film having an extremely flat surface may be prepared.

The precursor film may be converted to the perovskite compound film by using this intramolecular exchange reaction, and accordingly, the adduct of halogenated metal and guest molecule is preferably a solvate or a hydrogen halide which satisfies the above-described Chemical Formula 1. The solvate or the hydrogen halide which satisfies the above-described Chemical Formula 1 has excellent chemical reactivity to exhibit high solubility, such that a thicker precursor film may be prepared. The perovskite compound is formed by the exchange of the guest molecule and the organic halide, thereby preparing a high-quality perovskite film due to excellent reactivity even in a thick film in a short time. Further, due to the excellent reactivity, it is possible to form a large crystal grain compared with the conventional method. In addition, since almost no volume change occurs upon conversion to the perovskite compound film, even after the reaction, a smooth surface itself of the film (precursor film) applied and dried by substantially using a solution coating method is able to be maintained almost without change.

Specifically, when the adduct of halogenated metal and guest molecule is the solvate or hydrogen halide satisfying the above-described Chemical Formula 1, it is possible to prepare a perovskite compound film having an extremely flat and smooth surface in which a root mean square (rms) surface roughness is 4.0 nm or less, and a maximum peak height (Rp) of a film surface is 6.0 nm or less by preventing the volume change.

The adduct of halogenated metal and guest molecule may be prepared to be used or may be purchased if it is a material known in the art. As a specific and non-limiting example, the adduct of halogenated metal and guest molecule may be prepared by a method including a step of adding drop-wise a solution in which the halogenated metal (or a metal cation and a halogen anion having a stoichiometric ratio of the halogenated metal) and the guest molecule are dissolved in a non-solvent.

More specifically, when the adduct of halogenated metal and guest molecule is the solvate, the adduct of halogenated metal and guest molecule may be prepared by a method including a step of preparing an adduct solution by dissolving a halogenated metal or a metal cation and a halogen anion corresponding to the stoichiometric ratio of the halogenated metal in a solvent which is a guest molecule, a step of adding drop-wise the adduct solution in a non-solvent; and a step of separating and recovering a solid phase obtained by the drop-wise adding.

Here, the non-solvent to which the adduct solution is introduced may mean an organic solvent that does not dissolve the halogenated metal and does not have miscibility with the guest molecule as the solvent. Here, the description "that does not dissolve the halogenated metal" may mean an organic solvent in which a solubility of the halogenated metal is less than 0.1 M, specifically less than 0.01 M, and more specifically less than 0.001 M, at 20° C. under 1 atm. The description that the non-solvent does not have miscibility with the solvent (guest molecule) that dissolves the halogenated metal, may mean that when the non-solvent and the solvent of the adduct solution are mixed with each other, layers are separated in a static state in which physical stirring is not performed. An example of the non-solvent may include a non-polar organic solvent, and the non-polar organic solvent may be one or two or more organic solvent selected from the group consisting of pentane, hexene, cyclohexene, 1,4-dioxane, benzene, toluene, triethylamine, chlorobenzene, ethylamine, ethylether, chloroform, ethyl acetate, acetic acid, 1,2-dichlorobenzene, tert-butyl alcohol, 2-butanol, isopropanol, and methyl ethyl ketone, but is not limited thereto.

More specifically, when the adduct of halogenated metal and guest molecule is the solvate, the adduct of halogenated metal and guest molecule may be prepared by a method including a step of preparing an adduct solution by dissolving a halogenated metal or a metal cation and a halogen anion corresponding to the stoichiometric ratio of the halogenated metal in a solvent which is a guest molecule, a step of adding drop-wise the adduct solution in a non-solvent; a step of separating and recovering a solid phase obtained by the drop-wise adding; and a step of heat-treating the separated and recovered solid phase to control a relative molar ratio of the guest molecule to the halogenated metal in the solid phase. That is, the solid phase formed by adding drop-wise the adduct solution in the non-solvent may be separated and recovered, thereby preparing a first adduct of halogenated metal and guest molecule, and a molar ratio of the guest molecule to the halogenated metal of the first adduct of halogenated metal and guest molecule may be reduced through heat treatment, thereby preparing a second adduct of halogenated metal and guest molecule. This is an aspect of controlling an amount of the guest molecule contained in the adduct of halogenated metal and guest molecule so that the volume change during the exchange reaction with the organic halide may be minimized as the crystalline perovskite compound may be prepared by the intermolecular exchange reaction between the guest molecule contained in the adduct of halogenated metal and guest molecule, and the organic halide. The adduct of halogenated metal and guest molecule has a state in which the halogenated metal and the guest molecule are weakly bonded by non-covalent bond, the guest molecule contained in the adduct of halogenated metal and guest molecule may be volatilized and removed through a low temperature heat treatment. In view of preparing a stable, homogeneous and reproducible adduct, this heat treatment is preferably performed when a stable or meta-stable phase in two or more different compositions between the halogenated metal and the guest molecule in the adduct of halogenated metal and guest molecule is formed. A heat treatment temperature may be appropriately controlled in consideration of a material of the guest molecule. However, the heat treatment is preferably performed at a temperature of 100° C. or less, specifically 50 to 80° C., more specifically 60 to 80° C., in consideration that the halogenated metal and the guest molecule are weakly bonded by the non-covalent bond.

Independently of this, as described below, the precursor film may be prepared by directly applying a solution containing the metal halide and the guest molecule onto the substrate layer.

As described above, the preparation method according to an exemplary embodiment of the present invention includes a) forming a precursor film containing an adduct of a halogenated metal and a guest molecule (an adduct layer) on a substrate layer; and b) reacting the precursor film with an organic halide to prepare an inorganic/organic hybrid perovskite compound film.

Step a) may include applying a first solution containing the adduct of halogenated metal and guest molecule, or a second solution containing a halogenated metal and a guest molecule to a substrate layer.

In detail, in step 1), the first solution in which the adduct of halogenated metal and guest molecule is dissolved in a solvent may be applied to form the precursor film, or the second solution containing the halogenated metal and the guest molecule may be applied to form the adduct of halogenated metal and guest molecule and to prepare the precursor film at the same time. That is, a previously prepared adduct of halogenated metal and guest molecule may be used, or preparation of the adduct of halogenated metal and guest molecule and formation of the precursor film may be simultaneously performed. When the previously prepared adduct of halogenated metal and guest molecule is used, it is advantageous since a molar concentration of the adduct of halogenated metal and guest molecule in the first solution may be increased, and when the second solution is used to prepare the precursor film while simultaneously forming the adduct of halogenated metal and guest molecule, it is advantageous since a preparation process is simpler.

Specifically, when the adduct of halogenated metal and guest molecule is the solvate, the adduct solution may be prepared by dissolving the halogenated metal or the metal cation and the halogen anion corresponding to the stoichiometric ratio of the halogenated metal in the solvent which is the guest molecule, and may be applied onto the substrate layer on which the precursor film is to be formed, thereby preparing the precursor film containing the adduct of halogenated metal and guest molecule. At this time, a step of sequentially applying a non-solvent (non-solvent which does not dissolve the halogenated metal described above, specifically, a non-polar organic solvent) after the adduct solution is applied onto the substrate layer, may be further performed. However, when the solvent which is the guest molecule, has high volatility, the adduct solution may be dried while almost simultaneously being applied. Accordingly, the application of the non-solvent may be selectively performed.

Independently, the precursor film may be formed using the solution in which the adduct of halogenated metal and guest molecule is dissolved in the solvent. That is, the first solution may contain the adduct of halogenated metal and guest molecule and a solvent that dissolves the adduct of halogenated metal and guest molecule. Here, since the halogenated metal and the guest molecule in the adduct of halogenated metal and guest molecule are relatively weakly bonded, the solvent may be a general polar organic solvent that dissolves the halogenated metal. As a specific example, the solvent of the first solution containing the adduct of halogenated metal and guest molecule may be N,N-dimethylformamide (DMF), gamma-butyrolactone (GBL), 1-methyl-2-pyrrolidone, N,N-dimethylacetamide or a mixed solvent thereof, but is not limited thereto.

As described above, the adduct of halogenated metal and guest molecule may have a higher solubility than the halogenated metal itself due to high reactivity thereof. Accordingly, the adduct of halogenated metal and guest molecule of the first solution containing the adduct of halogenated metal and guest molecule may have a molar concentration of 1.0 M to 2.2 M.

Independently, the precursor film of the adduct of halogenated metal and guest molecule may be formed by dissolving the halogenated metal and the guest molecule in a solvent in which both the halogenated metal and the guest molecule are dissolved, at a molar ratio of forming a thermodynamically crystalline stable phase or a crystalline meta-stable phase, and applying the prepared solution (second solution) onto the substrate layer. As a specific example, when the guest molecule is hydrogen halide, the second solution may contain 0.5 to 2 moles of hydrogen halide, based on 1 mole of the halogenated metal, and a molar concentration of the halogenated metal in the second solution may be 0.8 M to 2.2 M.

The application may be performed by a coating method or a printing method commonly used for application of a liquid phase or a dispersed phase. As a specific example, the coating may be dip coating, spin coating, casting, etc., and the printing may be screen printing, inkjet printing, hydrostatic printing, microcontact printing, imprinting, gravure printing, reverse offset printing, or gravure offset printing, etc. Here, the spin coating may form a large area precursor film in a uniform thickness in a short time.

When applying the solution to form the precursor film, the applying process such as spin coating may be performed to achieve substantial drying, and thus, the drying step may not be performed separately. However, when the drying step is performed according to the process needs, it is preferred to perform low-temperature drying, in which the bond of the guest molecule bounded to the halogenated metal is broken and not volatilized and removed. A drying temperature may be appropriately changed in consideration of the material of the guest molecule, but the drying may be performed stably from room temperature to 70° C., and more stably from room temperature to 50° C.

In the preparation method according to an exemplary embodiment of the present invention, the precursor film may have a thickness of 5 nm to 800 nm. Since the precursor film is converted to the perovskite compound film by reaction with the organic halide, a thickness of the perovskite compound film to be prepared may be controlled through a thickness of the precursor film. Here, the thickness of the precursor film may be appropriately adjusted in consideration of the use of the perovskite compound film. However, as described above, the precursor film may be prepared into an extremely thick film having a thickness of 800 nm by the adduct of halogenated metal and guest molecule which is possible to be prepared using a high concentration of solution relative to the halogenated metal due to high reactivity. Further, due to the rapid and excellent reactivity of the adduct of halogenated metal and guest molecule, even this thick film may be converted completely to the perovskite compound film without unreacted residual material.

As described above, in consideration of the use of the perovskite compound film, the thickness of the precursor film may be suitably controlled, and the present invention is not able to be limited by the thickness of the precursor film. As a specific and non-limiting example, when a perovskite compound film is used as an element composing a light emitting layer of an organic light emitting device, a thickness of the precursor film may be about 5 to 100 nm, and when the perovskite compound film is used as an element composing the light absorbing layer of the solar cell, a thickness of the precursor film may be 300 nm to 800 nm, and specifically 300 to 600 nm.

After the precursor film is formed on the substrate layer, a step of reacting the precursor film with an organic halide to prepare an inorganic/organic hybrid perovskite compound film may be performed.

In detail, step b) may be performed by applying a third solution containing the organic halide onto the precursor film. The third solution may include an organic halide and a solvent that dissolves the organic halide.

The process of dissolving the organic halide metal in a liquid phase, applying the organic halide to react with the precursor film is very advantageous for the intramolecular exchange reaction between the guest molecule of the precursor film and the organic halide. This is because it is possible to achieve homogeneous and stable contact between the organic halide and the precursor film at a low temperature including room temperature, and thus, the guest molecule is able to be removed from the precursor film mainly by the exchange reaction. Further, the liquid film containing the organic halide formed by the applying may act as a supply source for supplying the organic halide to the precursor film stably so that the exchange reaction is able to be continuously and rapidly generated even in a large area.

At the time of applying the third solution, it is preferable to use a solvent in which the solvent of the organic halide solution does not dissolve the adduct of halogenated metal and guest molecule in order to prevent the precursor film from being dissolved again. As a specific example, the solvent that dissolves the organic halide may be one or more selected from tert-butyl alcohol, 2-butanol, isobutyl alcohol, 1-butanol, isopropanol, 1-propanol, ethanol, methanol, etc., but is not limited thereto.

As described above, the adduct of halogenated metal and guest molecule may have a higher solubility than the halogenated metal itself due to high reactivity thereof. Accordingly, the adduct of halogenated metal and guest molecule of the first solution may have a molar concentration of 1.0 M to 2.2 M. Independently, the molar concentration of the organic halide of the third solution may be 10 mM to 200 mM, but is not limited thereto.

The applying of the third solution may be performed by an application method that is generally used for forming the film by applying and drying the liquid phase. As a specific example, spin coating may be used, but the present invention is not limited by the application method of the second solution.

After the third solution is applied on the precursor film, drying may be performed, wherein a temperature for drying is sufficient as it is a temperature at which the solvent is easily volatilized and removed. As a specific example, the drying may be performed at a temperature of from room temperature to 90° C. However, if the solvent of the third solution is highly volatile, an applying process such as spin coating may be performed, and substantial drying may be achieved, and thus, the drying may be selectively performed as needed.

As described above, due to extremely high reactivity of the adduct of halogenated metal and guest molecule, the precursor film may be converted to a high-quality perovskite compound film even through a simple process of applying the second solution to the precursor film at room temperature.

Specifically, according to an embodiment, even though the simple method of applying the solution at room temperature is used, the perovskite compound is prepared very quickly and easily by the dynamic reaction of exchange between the guest molecule and the organic halide, and coarse perovskite compound crystal grains may be produced. Nucleation of the perovskite compound and the volume change at the time of growth are not substantially caused, and thus, the perovskite compound film having an extremely smooth surface with an extremely low surface roughness may be prepared.

The conversion to the perovskite compound film by the room temperature reaction means that even if a substructure of the precursor film contains an organic material that is vulnerable to heat, it is possible to prepare a high quality perovskite compound film even without damaging the organic material.

That is, the preparation method according to an embodiment of the present invention is able to prepare a high quality perovskite compound film through a room temperature reaction based on simple solution application, and thus, the preparation method is significantly suitable for preparing flexible devices with commercial significance such as ease of process and cost reduction of process construction, etc.

In the preparation method according to an exemplary embodiment of the present invention, the organic halide reacting with the precursor film may be the following Chemical Formula 2:

$$AX \quad \text{(Chemical Formula 2)}$$

in Chemical Formula 2, A is a monovalent organic cation, i.e., one or two organic cations selected from ammonium group cations and amidinium group cations, and X is one or two or more halogen anions selected from $Cl^-$, $Br^-$, $F^-$, and $I^-$. Here, X in Chemical Formula 1 and X in Chemical Formula 2 may be the same as or different from each other. That is, independently of the X in Chemical Formula 1, X in Chemical Formula 2 may be one or two or more halogen anions selected from $Cl^-$, $Br^-$, $F^-$, and $I^-$.

In Chemical Formula 2, the ammonium group cation may be an organic ammonium ion, and A may be an amidinium group ion, an organic ammonium ion or an amidinium group ion and an organic ammonium ion.

In detail, the organic ammonium ion may satisfy the following Chemical Formula 3 or 4.

$$(R_1-NH_3^+)X \quad \text{(Chemical Formula 3)}$$

in Chemical Formula 3, $R_2$ is C1-C24 alkyl, C3-C20 cycloalkyl or C6-C20 aryl, and X is one or two or more halogen ions selected from $Cl^-$, $Br^-$, $F^-$, and $I^-$.

$$R_2-C_3H_3N_2^+-R_3)X \quad \text{(Chemical Formula 4)}$$

in Chemical Formula 4, $R_2$ is C1-C24 alkyl, C3-C20 cycloalkyl or C6-C20 aryl, and $R_3$ is hydrogen or C1-C24 alkyl, X is one or two or more halogen ions selected from $Cl^-$, $Br^-$, $F^-$, and $I^-$.

As a non-limiting and specific example, in Chemical Formula 3, $R_1$ may be C1-C24 alkyl, preferably C1-C7 alkyl, and more preferably, methyl. In Chemical Formula 4, $R_2$ may be C1-C24 alkyl, $R_3$ may be hydrogen or C1-C24 alkyl, preferably $R_2$ may be C1-C7 alkyl, $R_3$ may be hydrogen or C1-C7 alkyl, and more preferably, $R_2$ may be methyl, and $R_3$ may be hydrogen. As a non-limiting and specific example, the organic halide may be $CH_3NH_3I$, $CH_3NH_3Cl$, or $CH_3NH_3Br$.

This is because a size of the unit cell of the perovskite compound is related to a band gap, and a small unit cell size may have a band gap of energy at 1.5 to 1.1 eV that is suitable for utilization as a solar cell. However, $R_1$ of Chemical Formula 3 or $R_2$ and $R_3$ of Chemical Formula 4 may be appropriately selected in consideration of the use of the perovskite compound film, i.e., a design of wavelength band of light to be absorbed when the perovskite compound film is used as a light absorbing layer of a solar cell, a design of light emitting wavelength band when the perovskite compound film is used as a light emitting layer of a light emitting device, and an energy band gap and threshold voltage, etc., when the perovskite compound film is used as a semiconductor device of a transistor.

The amidinium group ion may satisfy the following Chemical Formula 5:

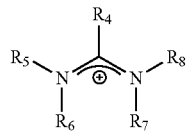

(Chemical Formula 5)

in Chemical Formula 5, $R_4$ to $R_8$ are each independently hydrogen, C1-C24 alkyl, C3-C20 cycloalkyl or C6-C20 aryl. As a non-limiting and specific example, in consideration of absorption of sunlight, $R_4$ to $R_8$ in Chemical Formula 5 may be each independently hydrogen, amino or C1-C24 alkyl, specifically hydrogen, amino or C1-C7 alkyl, and more specifically, hydrogen, amino or methyl. More specifically, $R_4$ may be hydrogen, amino or methyl, and $R_5$ to $R_8$ may be hydrogen. As a specific and non-limiting example, the amidinium group ion may include formamidinium ion ($NH_2CH=NH_2^+$) acetamidinium ion ($NH_2C(CH_3)=NH_2^+$) or guamidinium ion ($NH_2C(NH_2)=NH_2^+$). As a specific example of the amidinium group ion is considering the use of the light absorber of the solar cell. This is because a size of the unit cell of the perovskite compound is related to a band gap, and a small unit cell size may have a band gap energy of 1.5 to 1.1 eV that is suitable for utilization as a solar cell as described above. However, $R_2$ to $R_6$ of Chemical Formula 5 may be appropriately selected in consideration of the use of the perovskite compound film, i.e., a design of wavelength band of light to be absorbed when the perovskite compound film is used as a light absorbing layer of a solar cell, a design of light emitting wavelength band when the perovskite compound film is used as a light emitting layer of a light emitting device, and an energy band gap and threshold voltage, etc., when the perovskite compound film is used as a semiconductor device of a transistor.

As described above, the monovalent organic ion (A) of the organic halide may be a monovalent organic ammonium ion represented by $R_1$—$NH_3^+$ or $R_2$—$C_3H_3N_2^+$—$R_3$ described above based on Chemical Formulas 3 to 4, or the amidinium group described above based on Chemical Formula 5, or the organic ammonium ion and the amidinium group ion.

When the monovalent organic ion includes both the organic ammonium ion and the amidinium group ion, the organic halide may satisfy the following Chemical Formula 6:

$A'_{1-x}A_xX$  (Chemical Formula 6)

in Chemical Formula 6, A is a monovalent organic ammonium ion described above based on Chemical Formulas 3 to 4, A' is the amidinium group ion described above based on Chemical Formula 5, X is one or two or more halogen ions selected from $I^-$, $Br^-$, $F^-$, and $Cl^-$, and x is a real number of $0<x<1$.

When the organic halide contains the amidinium group ion and the organic ammonium ion as the monovalent organic cation, it is possible to prepare the perovskite compound film containing both the amidinium group ion and the organic ammonium ion in step b).

In Chemical Formula 6, preferably, x may be 0.3 to 0.05. Specifically, when a total number of moles of the monovalent organic cations is 1, 0.7 to 0.95 of the amidinium group ion and 0.3 to 0.05 of the organic ammonium ion may be contained. In this case, it is possible to prepare a perovskite compound film capable of faster migration and separation of exciton, and faster migration of photoelectron and photohole while capable of absorbing light with a very wide wavelength band.

In the preparation method according to an embodiment of the present invention, the precursor film containing the adduct of halogenated metal and guest molecule and/or the organic halide may contain two or more different halogen ions.

When the precursor film containing the adduct of halogenated metal and guest molecule and/or the organic halide of step b) contain(s) two or more different halogen ions, it is possible to prepare a perovskite compound film in which occurrence of a undesired different phase is prevented and stability of the crystal phase is enhanced, by the different halogen ions.

Specifically, the precursor film containing the adduct of halogenated metal and guest molecule and/or the organic halide may include two or more ions selected from iodine ion, chlorine ion and bromine ion, and preferably, iodine ion and bromine ion.

The halogen anions contained in the precursor film containing the adduct of halogenated metal and guest molecule and the organic halide may have a composition of 0.7 to 0.95 iodine ions and 0.3 to 0.05 bromine ions when assuming that a total number of moles of halogen anions contained in the perovskite compound film is 1, based on the composition of the perovskite compound film to be prepared. Specifically, the halogen anions contained in the precursor film and the organic halide may be composed so that X of $AMX_3$ prepared by the reaction of $MX_2(GM)_n$ according to Chemical Formula 1 and AX according to Chemical Formula 2 (wherein A is the same as A in Chemical Formula 2, M is the same as M in Chemical Formula 1, and $X_3$ is the sum of $X_2$ of Chemical Formula 1 and X of Chemical Formula 2), contains 0.7 to 0.95 iodine ions and 0.3 to 0.05 bromine ions, based on the composition of the perovskite compound film of $AMX_3$.

A relative molar ratio between the iodine ions and the bromine ion, that is, a molar ratio of 0.7 to 0.95 mol of iodine ions: 0.3 to 0.05 mol of bromine ions is a molar ratio capable of promoting formation of a single crystal phase and improving crystallinity, and improving moisture resistance of the perovskite compound film.

As a specific example, in the adduct of halogenated metal and guest molecule that satisfies Chemical Formula 1, X may be $X^a_{(1-y)}X^b_y$, $X^a$ and $X^b$ may be different halogen ions, and y may be a real number of 0<y<1. Preferably, in the adduct of halogenated metal and guest molecule that satisfies Chemical Formula 1, X may be $X^a_{(1-y)}X^b_y$, $X^a$ may be iodine ion, $X^b$ may be bromine ion, and y may be a real number of $0.05 \leq y \leq 0.3$.

As a more specific example, in the organic halide that satisfies Chemical Formula 2, X may be $X^a_{(1-y)}X^b_y$, $X^a$ and $X^b$ may be different halogen ions, and y may be a real number of 0<y<1. Preferably, in the organic halide that satisfies Chemical Formula 2, X may be $X^a_{(1-y)}X^b_y$, $X^a$ may be iodine ion, $X^b$ may be bromine ion, and y may be a real number of $0.05 \leq y \leq 0.3$.

However, the kind and composition of the halogen ion contained in the precursor film and the organic halide, respectively, may be different from each other, and as described above, the precursor film and the organic halide may have different halogen ions and different compositions from each other so that X contains 0.7 to 0.95 of iodine ions and 0.3 to 0.05 of bromine ions based on the composition $AMX_3$ of the finally obtained perovskite compound film.

In the preparation method according to an embodiment of the present invention, a reaction with an organic halide, specifically, a liquid organic halogen compound may be applied to a precursor film to prepare a perovskite compound film, and selectively, annealing for further coarsening crystal grains of the perovskite compound may be further performed. That, the preparation method according to an embodiment of the present invention may further include, after step b), step c) annealing the precursor film that reacts with the organic halide.

The annealing for further coarsening of the perovskite compound crystals composing the perovskite compound film may be performed at a low temperature of 50 to 180° C., and specifically, 80 to 150° C. Time for the annealing may be controlled to some extent depending on a thickness of the perovskite compound film obtained in step b), but may be 1 to 50 minutes, and specifically, 10 to 40 minutes.

The substrate layer on which the precursor film is formed may be a physical support for supporting the precursor film, and in addition, may be previously formed constituent elements that are conventionally required in corresponding uses under the perovskite compound film, depending on the use in which the perovskite compound film to be prepared is used.

As a specific example of the use, the perovskite compound film prepared by the preparation method according to an embodiment of the present invention may be used for a transistor, a light emitting element, a sensor light, an electronic element, an optical element, or a sensor light including the conventional perovskite compound as a constituent element.

That is, the preparation method according to an embodiment of the present invention may correspond to a step of forming a perovskite compound film in an electronic device, an optical element, or a sensor light, that includes the conventional perovskite compound as constituent element thereof.

In such an aspect, the substrate layer may serve not only as a support for physically supporting the precursor film but also may be formed with other constituent elements in addition to the perovskite compound film in the electronic element, the optical element or the sensor light, that includes the conventional perovskite compound as a constituent element thereof.

In an example of a solar cell in which the perovskite compound film is provided as a light absorber, the substrate layer may include a charge transport layer which is an electron transport layer or a hole transport layer, and the charge transport layer may have a porous structure or a dense structure.

When the charge transport layer has a porous structure, the precursor film may be a film that fills pores of the charge transport layer and covers one surface of the charge transport layer. In this case, the perovskite compound film that fills the pores of the charge transport layer and covers one surface of the charge transport layer may be prepared by step b).

When the charge transport layer has a dense structure, the precursor film may be a film deposited in contact with the charge transport layer. In this case, the perovskite compound film deposited in contact with the charge transport layer may be prepared by step b).

Hereinafter, the charge transport layer of the electron transport layer or the hole transport layer provided in the substrate layer is the same as or similar to the electron transport layer or the hole transport layer of the hybridized substrate to be described later, and thus, the above description may be used in the hybridized substrate for a solar cell, as a reference.

The present invention includes a perovskite compound film prepared by the above-described method for preparing a perovskite compound film.

In detail, the perovskite compound film according to an embodiment of the present invention is a polycrystal film, and may be a perovskite compound film having an average crystal grain diameter of 1 μm to 10 μm, specifically, 4 to 10 μm.

The perovskite compound film according to an embodiment of the present invention is characterized by having an extremely flat surface, and the surface of the film according to an embodiment of the present invention may have a root mean square (rms) surface roughness of 4.0 nm or less. Specifically, the surface roughness may be rms surface roughness measured using atomic force microscopy (AFM), and may be rms surface roughness for an area of 3×3 μm².

In addition, the surface of the perovskite compound film according to an embodiment of the present invention may have a maximum peak height (Rp) of 6.0 nm or less, wherein the maximum peak height (Rp) may be measured using atomic force microscopy (AFM) for an area of 3×3 μm². Here, in observing the surface of the perovskite compound film for measuring the surface roughness and maximum peak height, a region having the largest roughness on the surface of the film is observed through a scanning electron microscope, or the like.

The film composed of such extremely flat and extremely coarse crystal grains means to have a size and flatness that are able to be obtained by preparing the perovskite film by site exchange between the guest molecule of the adduct of halogenated metal and guest molecule and the organic halide as described above.

The film according to an embodiment of the present invention may have a thickness of 5 nm to 800 nm. An extremely thick film reaching 800 nm is a thickness that is able to be obtained by high reactivity by the guest molecule of the adduct of halogenated metal and guest molecule.

In the perovskite compound film according to an embodiment of the present invention, the perovskite compound may satisfy the following Chemical Formula 7:

$$AMX_3 \qquad \text{[Chemical Formula 7]}$$

in Chemical Formula 7, A is a monovalent organic ion, M is a divalent metal ion, and X is a halogen ion. Here, X may be one or two or more selected from I⁻, Br⁻, F⁻, and Cl⁻, M may be one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and A may be one or two organic cations selected from ammonium group cations and amidinium group cations.

In the perovskite compound film according to an embodiment of the present invention, in Chemical Formula 5, the monovalent organic ion may be one or two or more selected from amidinium group ions and organic ammonium ions.

Specifically, the perovskite compound film according to an embodiment of the present invention may satisfy the following Chemical Formula 8, 9, or 10:

$$AM(X^a_{(1-y)}X^b_y)_3 \quad \text{(Chemical Formula 8)}$$

in Chemical Formula 8, A may be a monovalent organic cation, an organic ammonium ion or an amidinium group ion, M may be a divalent metal ion, $X^a$ and $X^b$ may be different halogen ions, and y may be a real number of 0<y<1. Preferably, $X^a$ may be iodine ion, $X^b$ may be bromine ion, and y may be a real number of 0.05≤y≤0.3.

$$A'_{1-x}A_xMX_3 \quad \text{(Chemical Formula 9)}$$

in Chemical Formula 9, A is a monovalent organic ammonium ion described above based on Chemical Formulas 3 to 4, A' is an amidinium group ion described above based on Chemical Formula 5, X is a halogen ion, and x is a real number of 0<x<1. Preferably, x is a real number of 0.05≤x≤0.3. Here, the halogen ion is I⁻, Br⁻, F⁻ or Cl⁻.

$$A'_{1-x}A_xM(X^a_{(1-y)}X^b_y)_3 \quad \text{(Chemical Formula 10)}$$

in Chemical Formula 10, A is a monovalent organic ammonium ion described above based on Chemical Formulas 3 to 4, A' is an amidinium group ion described above based on Chemical Formula 5, M is a divalent metal ion, $X^a$ and $X^b$ are different halogen ions, and x is a real number of 0<x<1, and y is a real number of 0<y<1. Preferably, $X^a$ is an iodine ion, $X^b$ is a bromine ion, y is a real number of 0.05≤y≤0.3, and x is a real number of 0.05≤x≤0.3.

As described above, the precursor film and the organic halide may have a composition so that the perovskite compound film prepared by reacting $MX_2$ of Chemical Formula 1 and AX of Chemical Formula 2 at a stoichiometric ratio satisfies the above-described Chemical Formula 8, 9 or 10.

As a specific and non-limiting example, the perovskite compound may have compositions such as $CH_3NH_3PbI_xCl_y$ (x is a real number of 0≤x≤3, y is a real number of 0≤y≤3, and x+y=3), $CH_3NH_3PbI_xBr_y$ (x is a real number of 0≤x≤3, y is a real number of 0≤y≤3, and x+y=3), $CH_3NH_3PbCl_xBr_y$ (x is a real number of 0≤x≤3, y is a real number of 0≤y≤3, and x+y=3), $CH_3NH_3PbI_xF_y$ (x is a real number of 0≤x≤3, y is a real number of 0≤y≤3, and x+y=3), $NH_2CH=NH_2PbI_xCl_y$ (x is a real number of 0≤x≤3, y is a real number of 0≤y≤3, and x+y=3), $NH_2CH=NH_2PbI_xBr_y$ (x is a real number of y is a real number of 0≤y≤3, and x+y=3), $NH_2CH=NH_2PbCl_xBr_y$ (x is a real number of 0≤x≤3, y is a real number of 0≤y≤3, and x+y=3), $NH_2CH=NH_2PbI_xF_y$ (x is a real number of 0≤x≤3, y is a real number of 0≤y≤3, and x+y=3), $NH_2CH=NH_{2(1-x)}CH_3NH_{3x}Pb(I_{(1-y)}Br_y)_3$ (x is a real number of 0≤x≤1, and y is a real number of 0≤y≤1), $NH_2CH=NH_{2(1-x)}CH_3NH_3Pb(I_{(1-y)}Br_y)_3$ (x is a real number of 0.05≤x≤0.3, and y is a real number of 0.05≤y≤0.3), $NH_2CH=NH_{2(1-x)}CH_3NH_{3x}Pb(I_{(1-y)}Br_y)_3$ (x is a real number of 0.05≤x≤0.3), $NH_2C(CH_3)=NH_2PbI_xCl_y$ (x is a real number of 0≤x≤3, y is a real number of 0≤y≤3, and x+y=3), $NH_2C(CH_3)=NH_2PbI_xBr_y$ (x is a real number of 0≤x≤3, y is a real number of 0≤y≤3, and x+y=3), $NH_2C(CH_3)=NH_2PbCl_xBr_y$ (x is a real number of 0≤x≤3, y is a real number of 0≤y=3, and x+y=3), $NH_2C(CH_3)=NH_2PbI_xF_y$ (x is a real number of 0≤x≤3, y is a real number of 0≤y≤3, and x+y=3), $NH_2C(CH_3)=NH_{2(1-x)}CH_3NH_{3x}Pb(I_{(1-y)}Br_y)_3$ (x is a real number of 0≤x≤1, and y is a real number of 0≤y≤1), $NH_2C(CH_3)=NH_{2(1-x)}CH_3NH_{3x}Pb(I_{(1-y)}Br_y)_3$ (x is a real number of 0.05≤x≤0.3, and y is a real number of 0.05≤y≤0.3), $NH_2C(CH_3)=CH_{2(1-x)}CH_3NH_{3x}Pb(I_{(1-x)}Br_x)_3$ (x is a real number of 0.05≤x≤0.3), $NH_2C(NH_2)=NH_2PbI_xCl_y$ (x is a real number of 0≤x≤3, y is a real number of 0≤y≤3, and x+y=3), $NH_2C(NH_2)=NH_2PbI_xBr_y$ (x is a real number of 0≤x≤3, y is a real number of 0≤y≤3, and x+y=3), $NH_2C(NH_2)=NH_2PbCl_xBr_y$ (x is a real number of 0≤x≤3, y is a real number of 0≤y≤3, and x+y=3), $NH_2C(NH_2)=NH_2PbI_xF_y$ (x is a real number of 0≤x≤3, y is a real number of 0≤y≤3, and x+y=3), $NH_2C(NH_2)=NH_{2(1-x)}CH_3NH_{3x}Pb(I_{(1-y)}Br_y)_3$ (x is a real number of 0≤x≤1, and y is a real number of 0≤y≤1), $NH_2C(NH_2)=CH_{2(1-x)}CH_3NH_{3x}Pb(I_{(1-y)}Br_y)_3$ (x is a real number of 0.05≤x≤0.3, and y is a real number of 0.05≤y≤0.3), $NH_2C(NH_2)=CH_{2(1-x)}CH_3NH_{3x}Pb(I_{(1-x)}Br_x)_3$ (x is a real number of 0.05≤x≤0.3), etc.

A hybridized substrate for a solar cell according to the present invention may include a precursor film containing an adduct of halogenated metal and guest molecule (an adduct layer) on a substrate layer.

Specifically, the hybridized substrate for a solar cell may include a substrate layer, and a precursor film containing an adduct of halogenated metal and guest molecule (an adduct layer), positioned on the substrate layer.

In the hybridized substrate for a solar cell according to an embodiment of the present invention, the guest molecule may be a solvent that dissolves the halogenated metal.

In the hybridized substrate for a solar cell according to an embodiment of the present invention, when the precursor film is converted to the inorganic/organic hybrid perovskite compound film in the hybridized substrate for a solar cell according to an embodiment of the present invention, a thickness change may be 20% or less based on a thickness of the precursor film.

The precursor film of the hybridized substrate for a solar cell, the organic halide of Chemical Formula 2, the reaction between the precursor film and the organic halide, etc., are related with the precursor film, the organic halide, the reaction between the precursor film and the organic halide, etc., to have the same as or similar description as described above, such as a material of adduct of halogenated metal and heterogeneous molecule, a material of guest molecule, a bonding state of the halogenated metal with the guest molecule, a thickness of the precursor film (adduct layer), a molecular exchange reaction between the guest molecule and the organic halide, the kind of the metal halide, etc., and thus, the description in the preparation method may be used as a reference.

Specifically, in the hybridized substrate for a solar cell according to an embodiment of the present invention, the precursor film may contain the adduct of halogenated metal and guest molecule.

The adduct of halogenated metal and guest molecule may be a compound containing the guest molecule together with the divalent metal cation and the halogen anion composing the inorganic/organic hybrid perovskite compound to be prepared. The adduct of halogenated metal and guest molecule may be a crystalline compound in which the halogenated metal ($MX_2$) of the divalent metal cation and the halogen anion composing the inorganic/organic hybrid perovskite compound, and the guest molecule are chemically bonded.

Structurally, the adduct of halogenated metal and guest molecule may have a structure in which the guest molecule is intercalated between layers of the halogenated metal having a layered structure.

In the hybridized substrate for a solar cell according to an embodiment of the present invention, the precursor film may be a film that is converted to an inorganic/organic hybrid perovskite compound by the intramolecular exchange reaction between the guest molecule contained in the adduct of halogenated metal and guest molecule and the organic halide.

Specifically, in the hybridized substrate for a solar cell, the precursor film may satisfy the following Relational Equation 1:

$$0 \leq \frac{|t_p - t_0|}{t_0} \leq 0.2 \qquad \text{(Relational Equation 1)}$$

in Relational Equation 1, $t_0$ is a thickness of the precursor film, and $t_p$ is a thickness of the perovskite compound film converted from the precursor film.

Specifically, the precursor film of the hybridized substrate for a solar cell, may satisfy the following Relational Equation 2:

$$0 \leq \frac{|t_p - t_0|}{t_0} \leq 0.15 \qquad \text{(Relational Equation 2)}$$

In Relational Equation 2, to is a thickness of the precursor film, and $t_p$ is a thickness of the perovskite compound film converted from the precursor film.

As a practical example, in the precursor film of the hybridized substrate for a solar cell, a thickness change of the perovskite compound film (thickness=$t_p$) may satisfy Relational Equation 1, and preferably, Relational Equation 2, when the perovskite compound film is prepared by applying a solution containing the adduct of the halogenated metal and the guest molecule to a flat substrate, thereby forming the precursor film having a thickness of 100 to 600 nm, and applying a solution containing $CH(NH_2)_2I$.

The adduct of halogenated metal and guest molecule contained in the precursor film of the hybridized substrate for a solar cell is preferably a compound in which the halogenated metal and the guest molecule are non-covalently bonded to each other, with the above-described Relational Equation 1, preferably, together with the above-described Relational Equation 2, or independently of the above-described Relational Equation 1 and Relational Equation 2. Specifically, the adduct may be a compound in which the halogenated metal and the guest molecule including oxygen, nitrogen, or oxygen and nitrogen which include non-covalent electron pairs, or a hydrogen compound including halogen halide. Thereby, the precursor film may be converted very rapidly to the perovskite compound film by the room temperature reaction with the organic halide.

In the hybridized substrate for a solar cell according to an embodiment, the guest molecule forming the crystalline compound with the halogenated metal may be a molecule including oxygen, nitrogen, or oxygen and nitrogen which include non-covalent electron pairs, or a hydrogen compound, and the guest molecule may be a simple molecule to a polymer.

As a specific example, in the adduct of halogenated metal and guest molecule, the guest molecule may be one or two or more materials selected from dimethylsulfoxide (DMSO), N-methyl-2-pyrrolidone (NMP), 2,2'-bipyridine, 4,4'-bipyridine-N,N'-dioxide, pyrazine, 1,10-phenanthroline, 2-methylpyridine or poly(ethylene oxide), hydrogen fluoride (HF), hydrogen chloride (HCl), hydrogen bromide (HBr), and hydrogen iodide (HI).

Preferably, the guest molecule of the adduct of halogenated metal and guest molecule may be a single molecule.

More preferably, the adduct of halogenated metal and guest molecule is preferably a solvate including the halogenated metal and a solvent that dissolves the halogenated metal, or a compound including the halogenated metal and hydrogen halide, so that the guest molecule intercalated between the layers of the halogenated metal having a layered structure is able to be easily diffused and removed, and exchanged with the organic halide at a low temperature including room temperature.

When the adduct of halogenated metal and guest molecule is the solvate, the adduct of halogenated metal and guest molecule may be a compound in which the halogenated metal is non-covalently bonded with the guest molecule which is the solvent of the halogenated metal. As a specific example, the guest molecule may be a solvent including oxygen, nitrogen, or oxygen and nitrogen, and dissolving the halogenated metal.

In the hybridized substrate for a solar cell according to an embodiment, as a specific example, the adduct of halogenated metal and guest molecule may satisfy Chemical Formula 1 below:

$MX_2(GM)_n$ <span style="float:right">(Chemical Formula 1)</span>

in Chemical Formula 1, M is a divalent metal cation, X is one or two or more halogen anions selected from $Cl^-$, $Br^-$, $F^-$, and $I^-$, GM is dimethylsulfoxide (DMSO) as a guest molecule, and n is a real number of 0.5 to 50. In view of prevention of the volume change which satisfies Relational Equation 1, n in Chemical Formula 1 may be 0.5 to 5, specifically n may be 0.5 to 2, and more specifically, n may be 0.5 to 1.5.

In the $MX_2$ in Chemical Formula 1, the M may be one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X may be one or two or more selected from $I^-$, $Br^-$, $F^-$, and $Cl^-$.

A solvate in which the halogenated metal is non-covalently bonded with a molecule of dimethylsulfoxide which is a solvent that dissolves the halogenated metal, may have a structure in which the molecule of dimethylsulfoxide is intercalated between layers of the halogenated metal ($MX_2$) having a layered structure. Due to this structure, the precursor film provided in the hybridized substrate for a solar cell may have extremely excellent reactivity with the organic halide at room temperature, and may be converted to a thick perovskite compound film in a short time.

In the hybridized substrate for a solar cell according to an embodiment, the adduct of halogenated metal and guest molecule may be a compound including a halogenated metal, and one or two or more hydrogen halides selected from hydrogen fluoride (HF), hydrogen chloride (HCl), hydrogen bromide (HBr), and hydrogen iodide (HI).

In the hybridized substrate for a solar cell according to an embodiment, when the adduct of halogenated metal and guest molecule is the solvate or the compound with the hydrogen halide which include Chemical Formula 1, it is possible to prepare the perovskite compound film having a thickness of 300 nm or more, and to prepare a perovskite compound film which is a dense film composed of coarse crystal grains having a perovskite compound grain size of 1 µm or more.

Also, in the hybridized substrate for a solar cell according to an embodiment, when the adduct of halogenated metal and guest molecule is the solvate or the compound with the hydrogen halide which include Chemical Formula 1, the volume change defined by Relational Equation 1 is 0.1 or less, and occurrence of volume change at the time of conversion to the perovskite compound film may be remarkably suppressed.

Further, in the hybridized substrate for a solar cell according to an embodiment, when the adduct of halogenated metal and guest molecule is the solvate or the compound with the hydrogen halide which satisfy the above-described Chemical Formula 1, it is possible to prepare a perovskite compound film having an extremely flat and smooth surface in which a root mean square (rms) surface roughness is 4.0 nm or less, and a maximum peak height (Rp) of a film surface is 6.0 nm or less by preventing the volume change.

In the hybridized substrate for a solar cell according to an embodiment, the thickness of the precursor film may be 5 nm to 800 nm, and specifically, the thickness of the precursor film may be 300 nm to 800 nm, and more specifically 300 to 600 nm.

In the hybridized substrate for a solar cell according to an embodiment, the precursor film may contact an organic halide represented by Chemical Formula 2 below to be converted to an inorganic/organic hybrid perovskite compound film by an intramolecular exchange reaction between the organic halide and the guest molecule of the precursor film. Here, the contact between the precursor film and the organic halide is preferably performed by applying a solution containing an organic halide to the precursor film.

$$AX \quad \text{(Chemical Formula 2)}$$

in Chemical Formula 2, A is a monovalent organic cation, i.e., one or two organic cations selected from ammonium group cations and amidinium group cations, and X is one or two or more halogen anions selected from $Cl^-$, $Br^-$, $F^-$, and $I^-$. Here, X in Chemical Formula 1 and X in Chemical Formula 2 may be the same as or different from each other. That is, independently of the X in Chemical Formula 1, X in Chemical Formula 2 may be one or two or more halogen anions selected from $Cl^-$, $Br^-$, $F^-$, and $I^-$.

In Chemical Formula 2, the ammonium group cation may be an organic ammonium ion, and A may be an amidinium group ion, an organic ammonium ion or an amidinium group ion and an organic ammonium ion.

In detail, the organic ammonium ion may satisfy the following Chemical Formula 3 or 4.

$$(R_1-NH^{3+})X \quad \text{(Chemical Formula 3)}$$

in Chemical Formula 3, $R_1$ is C1-C24 alkyl, C3-C20 cycloalkyl or C6-C20 aryl, and X is one or two or more halogen ions selected from $Cl^-$, $Br^-$, $F^-$, and $I^-$.

$$(R_2-C_3H_3N_2^+-R_3)X \quad \text{(Chemical Formula 4)}$$

in Chemical Formula 4, $R_2$ is C1-C24 alkyl, C3-C20 cycloalkyl or C6-C20 aryl, and $R_3$ is hydrogen or C1-C24 alkyl, X is one or two or more halogen ions selected from $Cl^-$, $Br^-$, $F^-$, and $I^-$.

As a non-limiting and specific example, in Chemical Formula 3, $R_1$ may be C1-C24 alkyl, preferably C1-C7 alkyl, and more preferably, methyl. In Chemical Formula 4, $R_2$ may be C1-C24 alkyl, $R_3$ may be hydrogen or C1-C24 alkyl, preferably $R_2$ may be C1-C7 alkyl, $R_3$ may be hydrogen or C1-C7 alkyl, and more preferably, $R_2$ may be methyl, and $R_3$ may be hydrogen. As a non-limiting and specific example, the organic halide may be $CH_3NH_3I$, $CH_3NH_3Cl$, or $CH_3NH_3Br$.

This is because a size of the unit cell of the perovskite compound is related to a band gap, and a small unit cell size may have a band gap energy of 1.5 to 1.1 eV that is suitable for utilization as a solar cell.

The amidinium group ion may satisfy the following Chemical Formula 5:

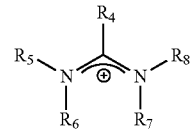

(Chemical Formula 5)

in Chemical Formula 5, $R_4$ to $R_8$ are each independently hydrogen, C1-C24 alkyl, C3-C20 cycloalkyl or C6-C20 aryl. As a non-limiting and specific example, in consideration of absorption of sunlight, $R_4$ to $R_8$ in Chemical Formula 5 may be each independently hydrogen, amino or C1-C24 alkyl, specifically hydrogen, amino or C1-C7 alkyl, and more specifically, hydrogen, amino or methyl. More specifically, $R_4$ may be hydrogen, amino or methyl, and $R_5$ to $R_8$ may be hydrogen. As a specific and non-limiting example, the amidinium group ion may include formamidinium ion ($NH_2CH=NH_2^+$), acetamidinium ion ($NH_2C(CH_3)=NH_2^+$) or guamidinium ion ($NH_2C(NH_2)=NH_2^+$). As a specific example of the amidinium group ion is considering the use of the light absorber of the solar cell. This is because a size of the unit cell of the perovskite compound is related to a band gap, and a small unit cell size may have a band gap energy of 1.5 to 1.1 eV that is suitable for utilization as a solar cell, as described above.

As described above, the monovalent organic ion (A) of the organic halide is a monovalent organic ammonium ion represented by $R_1-NH_3^+$ or $R_2-C_3H_3N_2^+-R_3$ described above based on Chemical Formulas 3 to 4, or the amidinium group described above based on Chemical Formula 5, or the organic ammonium ion and the amidinium group ion.

When the monovalent organic ion includes both the organic ammonium ion and the amidinium group ion, the organic halide may satisfy the following Chemical Formula 6:

$$A'_{1-x}A_xX \quad \text{(Chemical Formula 6)}$$

in Chemical Formula 6, A is a monovalent organic ammonium ion described above based on Chemical Formulas 3 to 4, A' is the amidinium group described above based on Chemical Formula 5, X is one or two or more halogen ions selected from $I^-$, $Br^-$, $F^-$, and $Cl^-$, and x is a real number of $0 \leq x \leq 1$.

When the organic halide contains the amidinium group ion and the organic ammonium ion as the monovalent organic cation, it is possible to prepare the perovskite compound film containing both the amidinium group ion and the organic ammonium ion in step b).

In Chemical Formula 6, preferably, x may be 0.3 to 0.05. Specifically, when a total number of moles of the monovalent organic cations is 1, 0.7 to 0.95 of the amidinium group ion and 0.3 to 0.05 of the organic ammonium ion may be contained. In this case, it is possible to prepare a perovskite compound film capable of faster migration and separation of exciton, and faster migration of photoelectron and photohole while capable of absorbing light of a very wide wavelength band.

In the hybridized substrate for a solar cell according to an embodiment, the precursor film containing the adduct of halogenated metal and guest molecule and/or the organic halide in contact (react) with the precursor film may contain two or more different halogen ions.

When the precursor film containing the adduct of halogenated metal and quest molecule and/or the organic halide reacted with the precursor film contain two or more different halogen ions, is possible to prepare a perovskite compound film in which occurrence of a undesired different phase is prevented and stability of the crystal phase is enhanced, by the different halogen ions.

Specifically, the precursor film containing the adduct of halogenated metal and guest molecule and/or the organic halide may include two or more ions selected from iodine ion, chlorine ion and bromine ion, and preferably, iodine ion and bromine ion.

The halogen anions contained in the precursor film containing the halogenated metal and guest molecule and the organic halide may have a composition of 0.7 to 0.95 iodine ions and 0.3 to 0.05 bromine ions when assuming that a total number of moles of halogen anions contained in the perovskite compound film is 1, based on the composition of the perovskite compound film to be prepared.

As a more specific example, in the adduct of halogenated metal and guest molecule that satisfies Chemical Formula 1, X may be $X^a_{(1-y)}X^b_y$, $X^a$ and $X^b$ may be different halogen ions, and y may be a real number of $0<y<1$. Preferably, in the adduct of halogenated metal and guest molecule that satisfies Chemical Formula 1, X may be $X^a_{(1-y)}X^b_y$, $X^a$ is iodine ion, $X^b$ is bromine ion, and y may be a real number of $0.05 \leq y \leq 0.3$.

As a more specific example, in the organic halide that satisfies Chemical Formula 2, X may be $X^a_{(1-y)}X^b_y$, $X^a$ and $X^b$ may be different halogen ions, and y may be a real number of $0<y<1$. Preferably, in the organic halide that satisfies Chemical Formula 2, X may be $X^a_{(1-y)}X^b_y$, $X^a$ may be iodine ion, $X^b$ may be bromine ion, and y may be a real number of $0.05 \leq y \leq 0.3$.

However, the kind and the composition of the halogen ion contained in the precursor film and the organic halide, respectively, may be different from each other, and the precursor film and the organic halide may have different halogen ions and different compositions from each other so that X contains 0.7 to 0.95 of iodine ions and 0.3 to 0.05 of bromine ions based on a composition $AMX_3$ of a perovskite compound film to be obtained by reacting the precursor film with the organic halide.

In the hybridized substrate for a solar cell according to an embodiment, the substrate layer may include an electron transport layer or a hole transport layer, and the charge transport layer may have a porous structure or a dense structure.

In detail, the substrate layer may include a substrate which is a support, an electrode positioned on the substrate; and a charge transport layer positioned on the electrode.

The substrate may be a rigid substrate or a flexible substrate. As a specific example, the substrate may be a rigid substrate including a glass substrate, or a flexible substrate including polyethylene terephthalate (PET); polyethylene naphthalate (PEN): polyimide (PI); polycarbonate (PC); polypropylene (PP); triacetylcellulose (TAC); polyether sulfone (PES), etc. However, the present invention is not limited by the kind of substrate.

The electrode may be any conductive electrode which is ohmic-junctioned to the charge transport layer which is an electron transport layer or a hole transport layer. The electrode is usable as long as it is a material commonly used as an electrode material of a front electrode or a rear electrode in a solar cell. As a non-limiting example, when the electrode is an electrode material of the rear electrode, the electrode may be one or more material selected from gold, silver, platinum, palladium, copper, aluminum, carbon, cobalt sulfide, copper sulfide, nickel oxide, and a combination thereof. As a non-limiting example, when the electrode is a transparent electrode, the electrode may be an inorganic conductive electrode such as fluorine doped tin oxide (FTO), indium doped tin oxide (ITO), ZnO, carbon nanotube (CNT), graphene, and an organic conductive metal such as PEDOT:PSS((poly(3,4-ethylenedioxythiophene) poly(styrenesulfonate)).

When a transparent solar cell is attempted to be provided, the electrode is preferably a transparent electrode, and when the electrode is an organic conductive electrode, it is more preferred when a flexible solar cell or a transparent solar cell is attempted to be provided.

The electrode may be formed by depositing or applying an electrode material on a substrate. The deposition may be formed using physical vapor deposition or chemical vapor deposition, and may be formed by thermal evaporation. The application may be performed by applying a solution in which the electrode material is dissolved or a dispersion solution of the electrode material on the substrate, followed by drying, or by selectively heat-treating the dried film. However, the electrode may be formed by using a method for forming a front electrode or a rear electrode in a conventional solar cell.

The charge transport layer positioned above the electrode may be an electron transport layer or a hole transport layer, and the charge transport layer may be a porous film or a dense film. When the charge transport layer is a porous film, the precursor film of the hybridized substrate for a solar cell may have a form of a film that fills pores of the charge transport layer and covers the charge transport layer. Here, a thickness of the film covering the charge transport layer may be 5 nm to 800 nm, specifically 300 nm to 800 nm, and more specifically 300 to 600 nm.

The electron transport layer may be an electron conductive organic material layer or an electron conductive inorganic material layer. The electron conductive organic material may be an organic material used as an n-type semiconductor in a conventional organic solar cell. As a specific and non-limiting example, the electron conductive organic material may include fullerenes (C60, C70, C74, C76, C78, C82, C95), fullerene derivatives including PCBM ([6,6]-phenyl-C61butyric acid methyl ester)), C71-PCBM, C84-PCBM, PC70BM([6,6]-phenyl C70-butyric acid methyl ester), PBI(polybenzimidazole), PTCBI(3,4,9,10-perylenetetracarboxylic bisbenzimidazole), F4-TCNQ(tetrauorotetracyanoquinodimethane) or a mixture thereof.

The electron conductive inorganic material may be a metal oxide conventionally used for electron transport in a conventional quantum dot-based solar cell or a dye-sensitized solar cell. As a specific example, the metal oxide may be one or two or more material selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, In oxide and SrTi oxide, and may be a mixture thereof or a composite thereof.

The electron transport layer may be a porous layer or a dense layer. The dense electron-transport layer may be a film of the electron conductive organic material or a dense film of the electron conductive inorganic material.

The porous electron transport layer may be a porous metal oxide layer. Here, the hybridized substrate for a solar cell may include a precursor film as a film that fills pores of the porous metal oxide layer and covers a surface of the porous metal oxide layer.

In view of improvement of power generation efficiency, the thickness of the porous metal oxide layer may be controlled by two factors of extinction according to an increase of a moving distance of photocurrent and an increase of a contact area between the porous electron transport layer and a light absorber (a light absorber in which the adduct of halogenated metal and guest molecule is reacted with the organic halide and converted). Specifically, the thickness of the porous metal oxide layer may have a thickness of 1000 nm or less, specifically 800 nm or less, more specifically 600 nm or less, and a lower limit of thickness of the porous metal oxide (layer) may be 50 nm.

Further, a diameter of metal oxide particles composing the porous metal oxide layer may be any particle size that is able to have a conventional specific surface area of a support or an electron transporter on which a dye (inorganic semiconductor quantum dots) is supported in a conventional dye-sensitized solar cell or a conventional inorganic semiconductor-based solar cell using inorganic semiconductor quantum dots as a dye. As a practical example, the diameter of the metal oxide particles may be 5 to 500 nm.

When a preparation method of the porous metal oxide layer is described in detail as an example, the electron transport layer may be prepared by applying, drying and heat-treating slurry containing metal oxide particles on the electrode. The slurry may be applied by one or more methods selected from screen printing; spin coating; bar coating; gravure coating; blade coating; and roll coating. However, the electron transport layer may be prepared by using a method for forming a porous electron transport layer of a metal oxide known in a conventional dye-sensitized solar cell or an organic solar cell.

When the electron transport layer is a porous structure, a dense electron transport film may be further provided between the electrode and the electron transport layer. The electron transport film may prevent the adduct of halogenated metal and guest molecule, which is converted to the perovskite compound of the electron transport layer from directly contacting with the electrode, and may transport electrons. The electron transport film may be any material as long as it is a material in which electrons are capable of moving spontaneously from the porous electron transport layer to the electrode through the electron transport film on an energy band diagram. As a non-limiting and specific example, the electron transport film may be a metal oxide thin film, and the metal oxide of the metal oxide thin film may be the same as or different from the metal oxide of the porous metal oxide. In detail, a material of the metal oxide thin film may be one or more material selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, In oxide and SrTi oxide, a mixture thereof, and a composite thereof. A thickness of the electron transport film may be substantially 10 nm or more, more practically 10 nm to 100 nm, and more practically 50 nm to 100 nm.

The electron transport film may be formed by applying or vapor deposition. Specifically, the electron transport film may be formed by using physical vapor deposition or chemical vapor deposition.

The hole transport layer may include an organic hole transport material, specifically, single molecular to polymeric organic hole transport material (hole conductive organic material). The organic hole transport material is usable as long as it is an organic hole transport material conventionally used for hole transport in a dye-sensitized solar cell or an organic solar cell.

A non-limiting example of the single molecule to low-molecular organic hole transport material may be one or two or more materials selected from pentacene, coumarin 6 [3-(2-benzothiazolyl)-7-(diethylamino)coumarin], ZnPC (zinc phthalocyanine), CuPC (copper phthalocyanine), TiOPC (titanium oxide phthalocyanine), spiro-MeOTAD (2,2',7,7'-tetrakis(N,N-p-dimethoxyphenylamino)-9,9'-spirobifluorene), F16CuPC (copper(II) 1,2,3,4,8,9,10,11,15,16, 17,18,22,23,24,25-hexadecafluoro-29H,31H-phthalocyanine), SubPc (boron subphthalocyanine chloride), and $N_3$(cis-di(thiocyanato)-bis(2,2'-bipyridyl-4,4'-dicarboxylic acid)-ruthenium(II)), but is not limited thereto.

In view of an energy matching aspect with the light absorber which is the perovskite compound, the hole transport material is preferably a polymer (hole-conductive polymer), and thus, stable solar cell operation may be assured, and further improved power generation efficiency may be obtained by energy matching with the light absorber. Specifically, the hole conductive polymer may be one or two or more materials selected from thiophene-based, paraphenylene vinylene-based, carbazole-based, and triphenylamine-based materials, and one or two or more selected from thiophene-based, and triphenylamine-based materials, and more preferably, a triphenylamine-based material. As a non-limiting example, the polymeric organic hole transport material may be one or two or more material selected from P3HT(poly[3-hexylthiophene]), MDMO-PPV(poly[2-methoxy-5-(3',7'-dimethyloctyloxyl)]-1,4-phenylene vinylene), MEH-PPV(poly[2-methoxy-5-(2"-ethylhexyloxy)-p-phenylene vinylene]), P3OT(poly(3-octyl thiophene)), POT(poly(octyl thiophene)), P3DT(poly(3-decyl thiophene)), P3DDT(poly(3-dodecyl thiophene), PPV(poly (p-phenylene vinylene)), TFB(poly(9,9'-dioctylfluorene-co-N-(4-butylphenyl)diphenyl amine), polyaniline, spiro-MeOTAD ([2,22',7,77'-tetrkis (N,N-di-p-methoxyphenyl amine)-9,9,9'-spirobi fluorine]), PCPDTBT(Poly[2,1,3-benzothiadiazole-4,7-diyl[4,4-bis(2-ethylhexyl-4H-cyclopenta[2,1-b:3,4-b']dithiophene-2,6-diyl]], Si-PCPDTBT(poly[(4,4'-bis(2-ethylhexyl)dithieno[3,2-b:2', 3'-d]silole)-2,6-diyl-alt-(2,1,3-benzothiadiazole)-4,7-diyl]), PBDTTPD(poly((4,8-diethylhexyloxyl)benzo([1,2-b:4,5-b'] dithiophene)-2,6-diyl)-alt-((5-octylthieno[3,4-c]pyrrole-4, 6-dione)-1,3-diyl)), PFDTBT(poly[2,7-(9-(2-ethylhexyl)-9-hexyl-fluorene)-alt-5,5-(4',7,-di-2-thienyl-2',1',3'-benzothiadiazole)]), PFO-DBT(poly[2,7-.9,9-(dioctyl-fluorene)-alt-5,5-(4',7'-di-2-thienyl-2',1',3'-benzothiadiazole)]), PSiFDTBT(poly[(2,7-dioctylsilafluorene)-2,7-diyl-alt-(4,7-bis(2-thienyl)-2,1,3-benzothiadiazole)-5,5'-diyl]), PSBTBT(poly[(4,4'-bis(2-ethylhexyl)dithieno[3,2-b:2',3'-d]silole)-2,6-diyl-alt-(2,1,3-benzothiadiazole)-4,7-diyl]), PCDTBT(Poly[[9-(1-octylnonyl)-9H-carbazole-2,7-diyl]-2,5-thiophenediyl-2,1, 3-benzothiadiazole-4,7-diyl-2,5-thiophenediyl]), PFB(poly (9,9'-dioctylfluorene-co-bis(N,N'-(4,butylphenyl))bis(N,N'- phenyl-1,4-phenylene)diamine), F8BT(poly(9,9'-dioctylfluorene-co-benzothiadiazole), PEDOT (poly(3,4-ethylenedioxythiophene)), PEDOT:PSS (poly(3,4-ethylenedioxythiophene) poly(styrenesulfonate)), PTAA (poly(triarylamine)), Poly(4-butylphenyl-diphenyl-amine), and a copolymer thereof.

The hole transport layer is formed so that the adduct of halogenated metal and guest molecule, which is converted to the light absorber, does not directly contact the electrode, and has a thickness sufficient to stably move holes. As a non-limiting and specific example, a thickness of the hole transport layer may be 5 nm and 500 nm.

The hole transport layer may further include an additive conventionally used for improving properties such as conductivity improvement of an organic-based hole conductive layer in a conventional inorganic semiconductor-based solar cell using an inorganic semiconductor quantum dot as a dye. As a non-limiting example, the hole transport layer may further contain one or two or more additives selected from tertiary butyl pyridine (TBP), lithium bis(trifluoro methanesulfonyl)imide) (LiTFSI), and tris(2-(1H-pyrazol-1-yl)pyridine)cobalt (III), and may contain 0.05 mg to 100 mg of additive per 1 g of the organic hole transport material. However, the present invention may not be limited by presence or absence of the additive in the hole transport layer, the kind of additive, and a content of the additive, etc.

The hole transport layer may be formed by applying a solution containing an organic hole transport material (hereinafter, referred to as an organic hole transport solution) onto the electrode and drying the solution. The applying may be performed by spin coating, but is not limited thereto. The solvent used for forming a hole transporter may be any solvent as long as it dissolves the organic hole transport material. However, the hole transporter may be formed by a method generally used for forming an n-type organic layer or a p-type organic layer in an organic solar cell.

The present invention includes a method for producing a solar cell using the above-described hybridized substrate for a solar cell.

In detail, the method for producing a solar cell according to an embodiment of the present invention may include applying an organic halide solution to a hybridized substrate for a solar cell that includes a substrate layer including a substrate as a support, an electrode positioned on the substrate, and a charge transport layer positioned on the electrode, and includes a precursor film formed on the substrate layer to convert the precursor film to a perovskite compound film, forming a second charge transport layer that transports a charge complementary to a charge transported by the charge transport layer on the perovskite compound film, and forming a second electrode opposite to the electrode.

When the charge transport layer of the substrate layer is an electron transport layer, the second charge transport layer that transports the complementary charge may be a hole transport layer. When the charge transport layer of the substrate layer is a hole transport layer, the second charge transport layer that transports the complementary charge may be an electron transport layer.

When the charge transport layer of the substrate layer is a porous electron transport layer, the hybridized substrate for a solar cell may include a substrate, an electrode positioned on the substrate, a porous electron transport layer disposed on the electrode, and a precursor film which is a film that fills pores of the porous electron transport layer and covers a surface of the porous electron transport layer. Here, a perovskite compound film, which is a film that fills pores of the porous electron transport layer and covers the surface of the porous electron transport layer may be prepared by applying an organic halide solution on the precursor film.

When the electrode of the substrate layer is a front electrode, a second electrode opposing thereto may be a rear electrode. When the electrode of the substrate layer is a rear electrode, a second electrode opposing thereto may be a front electrode.

A detailed description of a method for producing the second charge transport layer and the second electrode is the same as or similar to the electron transport layer or the electrode of the hybridized substrate for a solar cell described above, and thus, the overlapped description may be used as a reference.

The present invention includes a light emitting device including a perovskite compound film prepared by reacting the above-described precursor film with an organic halide, or the above-described perovskite compound film. The light emitting device may have a conventionally known structure, and may include the perovskite compound film described above as the light emitting layer or as a constituent element of the light emitting layer.

The present invention includes a transistor including a perovskite compound film prepared by reacting the above-described precursor film with an organic halide, or the above-described perovskite compound film. The transistor device may have a conventionally known structure, and may include the perovskite compound film described above as a semiconductor layer or a constituent element of the semiconductor layer.

The present invention includes a solar cell in which the above-described hybridized substrate for a solar cell includes the perovskite compound film prepared by reaction with the organic halide.

The present invention includes a solar cell module in which two or more solar cells described above, or two or more solar cells produced by the above-described production method, as unit cells, are arranged and electrically connected to each other. The solar cell module may have an arrangement and a structure of cells commonly used in solar cell fields, and may further include a conventional light collecting means for collecting sunlight, and a general optical block for guiding a sunlight path.

The present invention includes a device powered by the above-described solar cell or a solar cell produced by the above-described production method.

Hereinafter, there is provided an example of a perovskite compound containing a formamidinium ion as a monovalent organic cation while including $CH_3NH_3PbI_3$ which is a representative inorganic/organic hybrid perovskite compound as an example. However, it is provided to show superiority of the present invention experimentally, and it is to be understood that the present invention is not limited by materials provided in Examples.

PREPARATION EXAMPLE 1

Preparation of $PbI_2(DMSO)_2$ Precursor Material $PbI_2$ powder (lead iodide, 99%) purchased from Sigma-Aldrich Co., was stirred in a dimethylsulfoxide (hereinafter, referred to as DMSO) solvent at 60° C. for 2 hours to prepare a 0.8 M $PbI_2$-DMSO solution. Precipitate powder formed by adding drop-wise this solution to toluene was separated and recovered by a filter paper, and dried in a room-temperature vacuum oven for 6 hours.

FIG. 1(a) shows an X-ray diffraction analysis result of powder produced in Preparation Example 1, and it could be appreciated that the obtained powder is $PbI_2(DMSO)_2$ that was reported by H. Miyamae (Chemistry Lett., 9, 663, 1980).

PREPARATION EXAMPLE 2

Preparation of $PbI_2(DMSO)$ Precursor Material

The $PbI_2(DMSO)_2$ precursor material prepared in Preparation Example 1 was dried in a vacuum oven at 60° C. for 24 hours to obtain powder. The X-ray diffraction analysis result of this powder was shown in FIG. 1(b). It may be appreciated from FIG. 1 that X-ray diffraction pattern of $PbI_2(DMSO)$ precursor material was completely different from that of the $PbI_2(DMSO)_2$ precursor material, which indicated that this material is a material having a new crystal structure. It was confirmed from elemental analysis that this material was $PbI_2(DMSO)$ in which C and H were reduced by half as compared to $PbI_2(DMSO)_2$.

Example 1

The $PbI_2(DMSO)$ precursor material prepared in Preparation Example 2 was dissolved in a solvent of N,N-dimethylformamide (DMF) to prepare an adduct solution of $PbI_2(DMSO)$ at a concentration of 1.5 M at room temperature.

The prepared 1.5 M concentration of $PbI_2(DMSO)$ adduct solution was injected at once to a rotation center on a FTO substrate (a glass substrate coated with fluorine-containing tin oxide) (FTO: F-doped $SnO_2$, 8 ohms/$cm^2$, Pilkington), and spin-coated at 3000 rpm for 30 seconds. The X-ray diffraction analysis result of the thus-prepared thin film were shown in FIG. 1(c). As a result, a diffraction peak was observed in the vicinity of 2θ=10°, and thus, it could be appreciated that the $PbI_2(DMSO)$ film was well formed on the substrate.

A 250 mM concentration of $CH(NH_2)_2I$ (hereinafter, referred to as FAI) isopropanol solution was injected at once to a rotation center on the prepared $PbI_2(DMSO)$ film, and spin-coated at 3000 rpm for 30 seconds.

Figure 2:
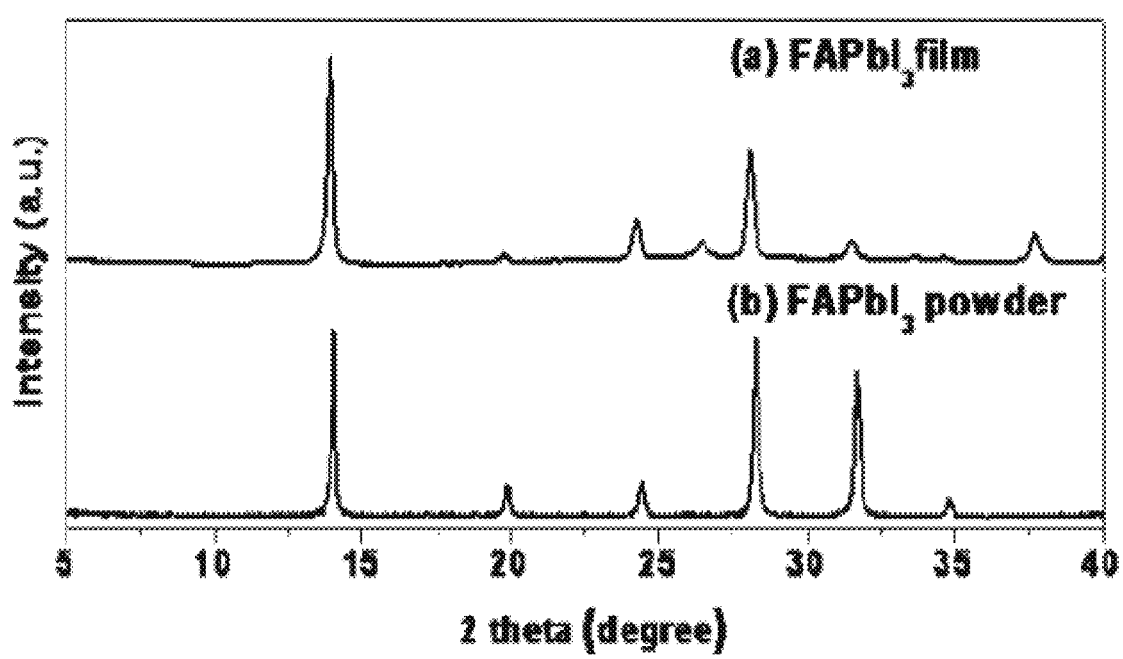
FIG. 2 shows an X-ray diffraction analysis result (FIG. 2(a)) of a perovskite compound film (film before annealing) obtained by applying a CH(NH₂)₂I isopropanol solution on the precursor film in Example 1, and an X-ray diffraction analysis result (FIG. 2(b)) of CH(NH₂)₂PbI₃ in powder form.

The X-ray diffraction analysis result of the film formed after the spin-coating was shown in FIG. 2(a). For comparison, the X-ray diffraction analysis result of $CH(NH_2)_2PbI_3$ powder (hereinafter, referred to as $FAPbI_3$) was shown in FIG. 2(b). It could be appreciated from FIG. 2 that the specific diffraction peak of the $PbI_2(DMSO)$ thin film disappeared, and diffraction peaks corresponding to the $CH(NH_2)_2PbI_3$ ($FAPbI_3$) perovskite compound were generated.

It indicated that only by applying the organic halide solution to the precursor film at room temperature, $CH(NH_2)_2I$ was reacted with $PbI_2(DMSO)$ phase while simultaneously removing the guest molecule (GM) of the precursor film, thereby achieving successful conversion to the perovskite compound.

It could be interpreted that the DMSO which is the guest molecule (GM) was intercalated between the $PbI_2$ layers having a layered structure and was contacted with the $CH(NH_2)_2I$ solution, such that the $CH(NH_2)_2I$ and the DMSO were easily exchanged, while simultaneously achieving crystallization into the perovskite compound. This is a crystal phase formation mechanism completely different from a conventional method of forming a deposition film of a metal halide film ($PbI_2$ film) and an organic halide film ($CH(NH_2)_2I$ film), followed by heat treatment, thereby converting the film to the perovskite compound by mutual diffusion.

Figure 3:
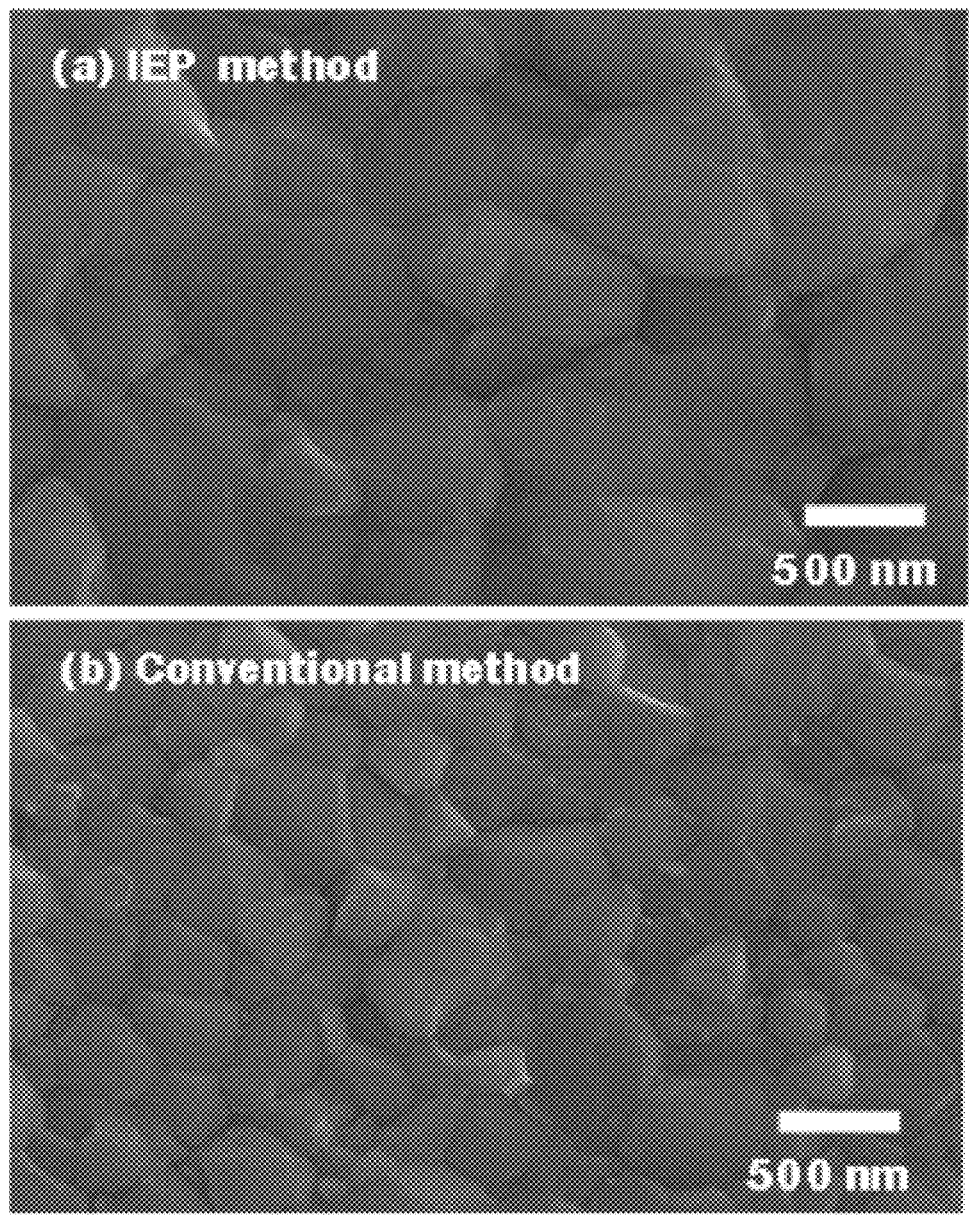
FIG. 3 is a scanning electron microscope image (FIG. 3(a)) of a perovskite compound film (after annealing) prepared in Example 1, and a scanning electron microscope image (FIG. 3(b)) of a perovskite compound film prepared in Comparative Example 1.

The $FAPbI_3$ thin film thus formed was heat-treated at 150° C. for 20 minutes to increase crystallinity. FIG. 3(a) is a scanning electron microscope image of a surface of a perovskite compound film prepared by heat-treatment. It could be appreciated that as compared with the scanning electron microscope image (FIG. 3(b)) of the thin film obtained in Comparative Example 1 to be provided below, relatively large crystal grains were formed in FIG. 3(a).

Figure 4:
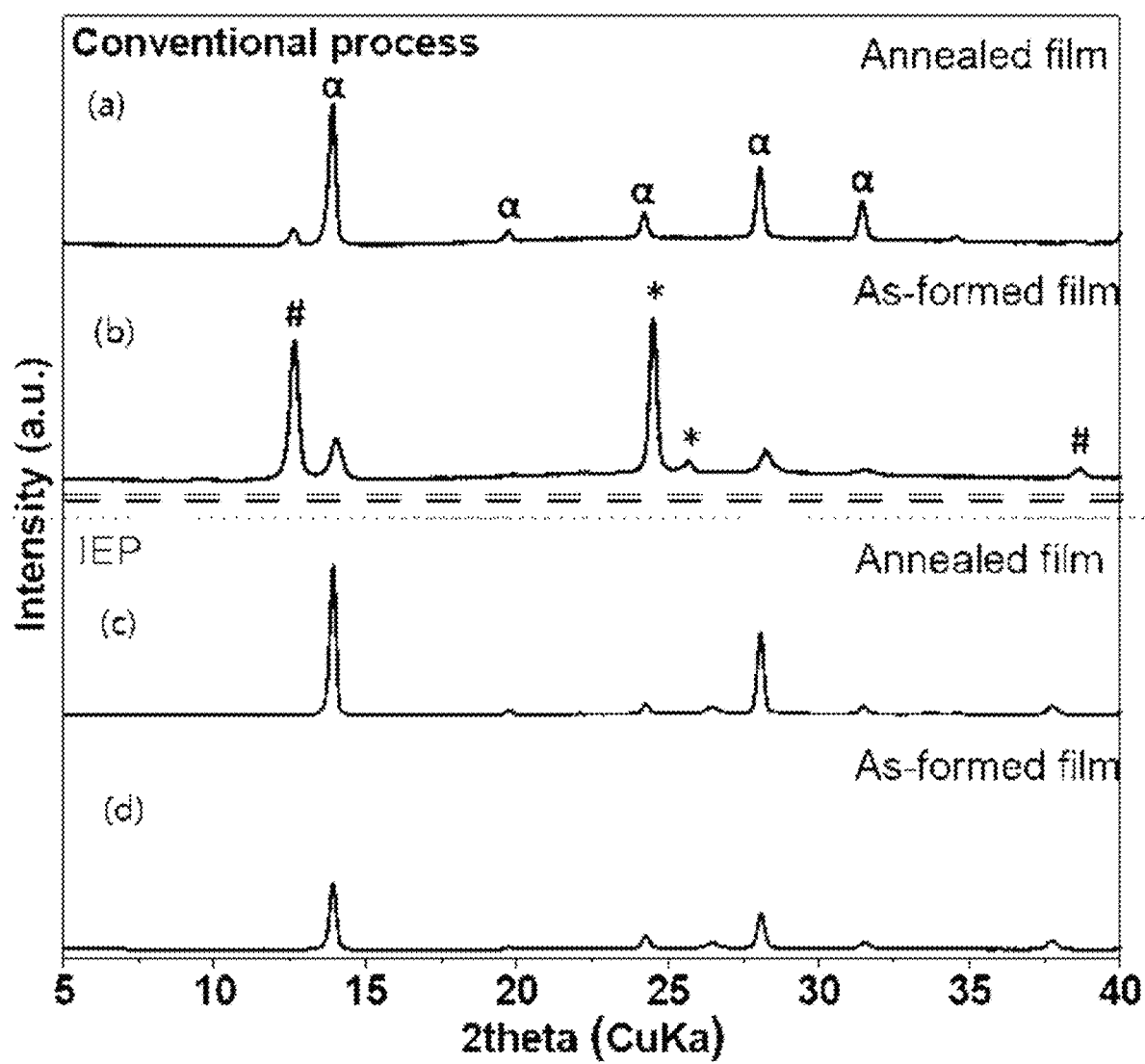
FIG. 4 shows an X-ray diffraction analysis results of the perovskite compound films (FIG. 4(a) and FIG. 4(b)) prepared in Comparative Example 1 before heat treatment (shown as an as-formed film in the drawing) and after heat treatment (shown as an annealed film in the drawing), and an X-ray diffraction analysis results of the perovskite compound films (FIG. 4(c) and FIG. 4(d)) prepared in Example 1 before heat treatment (shown as an as-formed film in the drawing) and after heat treatment (shown as an annealed film).

FIG. 4 shows X-ray diffraction pattern analysis results of $FAPbI_3$ thin films (FIG. 4(a) and FIG. 4(b)) prepared in Comparative Example 1 to be described below before heat treatment (shown as an as-formed film in the drawing) and after heat treatment (shown as an annealed film in the drawing), and X-ray diffraction analysis results of the $FAPbI_3$ thin films (FIG. 4(c) and FIG. 4(d)) prepared in Example 1 before heat treatment (shown as an as-formed film in the drawing) and after heat treatment (shown as an annealed film). It could be appreciated that the $FAPbI_3$ thin film prepared by the method of Example 1 crystallized by mutual molecular exchange was crystallized into the perovskite compound while simultaneously the $PbI_2(DMSO)$ precursor film was coated with $FAI(CH(NH_2)_2I)$ as described above. After heat-treatment at 1500 for 20 minutes, this thin film showed only an increase in peak intensity without formation of other secondary phases, and thus, which could be appreciated that only the crystal phase was improved. In addition, particularly, it could be appreciated that 13.9° and 28.1° peaks were particularly developed, which correspond to (−111) and (−222) planes of the $FAPbI_3$ ($CH(NH_2)_2PbI_3$) trigonal perovskite phase ($P_3m1$), and thus, it could be appreciated that the perovskite compound crystal grains were preferentially cultivated in a [111] direction. In the case of $FAPbI_3$ prepared in Comparative Example 1, that is, a $FAPbI_3$ thin film formed by forming a $FAI(CH(NH_2)_2I)$ thin film on a $PbI_2$ thin film, followed by crystallization by mutual diffusion during heat treatment, which is a conventional method, unlike the film prepared in Example 1, both FAI and $PbI_2$ existed immediately after the coating, and were crystallized to $FAPbI_3$ after the heat-treatment, but $PbI_2$ remained. In addition, it could be appreciated that the film of Comparative Example 1 was formed as a film without preferred orientation, whereas the film of Example 1 was preferentially cultivated in a [111] direction.

TABLE 1

|  | Thickness of before $FAI(CH(NH_2)_2I)$ coating | Thickness of perovskite film |
| --- | --- | --- |
| Comparative Example 1 | 290 nm ($PbI_2$ film) | 570 nm |
| Example 1 | 510 nm ($PbI_2(DMSO)$ film) | 560 nm |

Table 1 shows thicknesses of the films prepared in Example 1 and Comparative Example 1. Here, the thickness of the $PbI_2(DMSO)$ precursor film of Example 1 and the thickness of the $PbI_2$ film of Comparative Example 1 were measured by an alpha step, and thicknesses of the films heat-treated after FAI coating were measured and shown. It could be particularly appreciated that in Comparative Example 1, the thickness of the $PbI_2$ film was 290 nm, and the thickness thereof was largely increased to 570 nm after crystallization into the perovskite compound. However, it could be appreciated that the $PbI_2$ (DMSO) precursor film in Example 1 showed an insignificant thickness change from 510 nm to 560 nm after phase transition. It indicated that since the volume of the precursor film containing the guest molecule (GM) was larger than that of $PbI_2$, the FAI was easily exchanged with the DMSO to achieve crystallization into perovskite, wherein that phase transition was achieved with almost no volume change. The crystallization without the volume change has an advantage of minimizing the occurrence of defects and cracks in the preparation of high quality thin film. In conclusion, when the perovskite thin film is prepared through molecular exchange crystallization using the $PbI_2(DMSO)$ precursor film proposed in the present invention, a highly crystalline film with a large grain size and preferentially cultivated in a [111] direction is able to be prepared without the volume change, and thus, a high quality perovskite thin film is able to be prepared. This highly crystalline high quality thin film is very advantageous for a photoelectric conversion device such as a solar cell or a light emitting diode.

In addition, as a test result of solubility of $PbI_2(DMSO)$ at room temperature, it was experimentally confirmed that a solubility of $PbI_2$ (DMSO) with respect to N,N-dimethylformamide (DMF) solvent was 2.5 M, and thus, the $PbI_2$ (DMSO) precursor material had much higher solubility than a solubility of $PbI_2$ with respect to the DMF solvent, i.e., 1.0 M.

COMPARATIVE EXAMPLE 1

$PbI_2$ powder (lead iodide, 99%) purchased from Sigma-Aldrich Co., was dissolved in an N,N-dimethylformamide (hereinafter, referred to as DMF) solvent at room temperature to prepare a 1.0 M $PbI_2$ solution.

The prepared 1.0 M $PbI_2$ solution was applied (injected) to the rotation center on the FTO substrate at once, and spin-coated at 3000 rpm for 30 seconds to prepare a $PbI_2$ film.

A 250 mM concentration of $CH(NH_2)_2I$ isopropanol solution was injected at once to the rotation center on the $PbI_2$ film, and spin-coated at 3000 rpm for 30 seconds, thereby forming a $CH_3NH_3I$ film.

Then, the film was subjected to heat treatment at 150° C. and normal pressure for 30 minutes, thereby preparing a perovskite compound film.

Example 2

A glass substrate coated with fluorine-containing tin oxide (FTO: F-doped $SnO_2$, 8 ohms/$cm_2$, Pilkington, hereinafter referred to as a FTO substrate (first electrode)) was cut into a size of 25×25 mm, and ends thereof were etched to partially remove the FTO.

A 50 nm thick $TiO_2$ dense film as a metal oxide thin film was prepared on the cut and partially etched FTO substrate by a spray pyrolysis method. The spray pyrolysis was performed by using a solution of TAA (titanium acetylacetonate):EtOH (1:9 v/v %), and the thickness was controlled by repeating a method of spraying the solution on the FTO substrate placed on a hot plate maintained at 450° C. for 3 seconds, followed by stopping the spraying for 10 seconds.

An ethyl cellulose solution in which 10% by weight of ethyl cellulose was dissolved in ethyl alcohol, was added to $TiO_2$ powder having an average particle size (diameter) of 50 nm (prepared by hydrothermal treatment of a titanium peroxocomplex aqueous solution having an amount of 1 wt % based on $TiO_2$ at 250° C. for 12 hours), wherein the ethyl cellulose solution had 5 ml per 1 g of $TiO_2$ powder, and terpinol (5 g per 1 g of $TiO_2$ powder) was added and mixed. Then, ethyl alcohol was removed by vacuum distillation to prepare a $TiO_2$ paste.

Ethanol was added to the prepared $TiO_2$ paste to prepare a $TiO_2$ slurry for spin coating. The $TiO_2$ thin film of the FTO substrate was coated with the $TiO_2$ slurry for spin coating by a spin coating method, and heat-treated at 500° C. for 60 minutes. Then, the heat-treated substrate was immersed in a 30 mM $TiCl_4$ aqueous solution at 60° C., and left for 30 minutes. Then, the substrate was washed with deionized water and ethanol, dried, and then, heat-treated at 500° C. for 30 minutes to prepare a porous $TiO_2$ thin film (porous electron transport layer). A thickness of the prepared porous electron transport layer was 100 nm, a specific surface area was 33 $m^2$/g, and porosity (apparent porosity) was 50%.

A perovskite compound film was formed in the same manner as in Example 1, except that a 1.5 M $PbI_2(DMSO)_2$ solution was applied onto the prepared porous electron transport layer instead of the FTO substrate. It was confirmed through observation of the scanning electron microscope that the perovskite compound film was formed in the form of a film that completely filled the pores of the porous electron transport layer and covered the entire surface of the porous electron transport layer.

Then, the perovskite light absorber structure was spin-coated at 3000 rpm for 60 seconds with a toluene solution [15 mg (PTAA)/1 mL] in which PTAA (poly(triarylamine), EM index, Mw=17,500 g/mol) was dissolved, thereby forming a hole transport layer. Here, 2.31 mg of LiTFSI(lithium bis(trifluoro methanesulfonyl)imide) and 6.28 mg of TBP (tertiary butyl pyridine) per 1 g of PTAA as additives were added to the PTAA solution. Then, Au was vacuum-deposited on the hole transport layer by a high vacuum of thermal evaporator ($5\times10^{-6}$ torr or less) to form an Au electrode (second electrode) having a thickness of 70 nm, thereby producing a solar cell.

COMPARATIVE EXAMPLE 2

A solar cell was produced in the same manner as in Example 2, except that a perovskite compound film was formed in the same manner as in Comparative Example 1, instead of Example 1, in the step in which the perovskite compound film was formed after the porous electron transport layer was formed.

Example 3

A solar cell was produced in the same manner as in Example 2. However, in the production of the solar cell, a perovskite compound film was formed in the same manner as in Example 1 in the step in which the perovskite compound film was formed after the porous electron transport layer was formed, except that a 200 mM concentration of $CH_3NH_3I$ (hereinafter, MAI) isopropanol solution was used instead of using the 250 mM concentration of $CH(NH_2)_2I$ isopropanol solution in Example 1, thereby forming a $CH_3NH_3PbI_3$ (hereinafter, referred to as $MAPbI_3$) perovskite compound film. Here, the $MAPbI_3$ thin film was subjected to annealing with a heat treatment temperature of 100□, which is unlike the heat treatment condition (150° C.) at the time of preparing the $FAPbI_3$ thin film.

Figure 5:
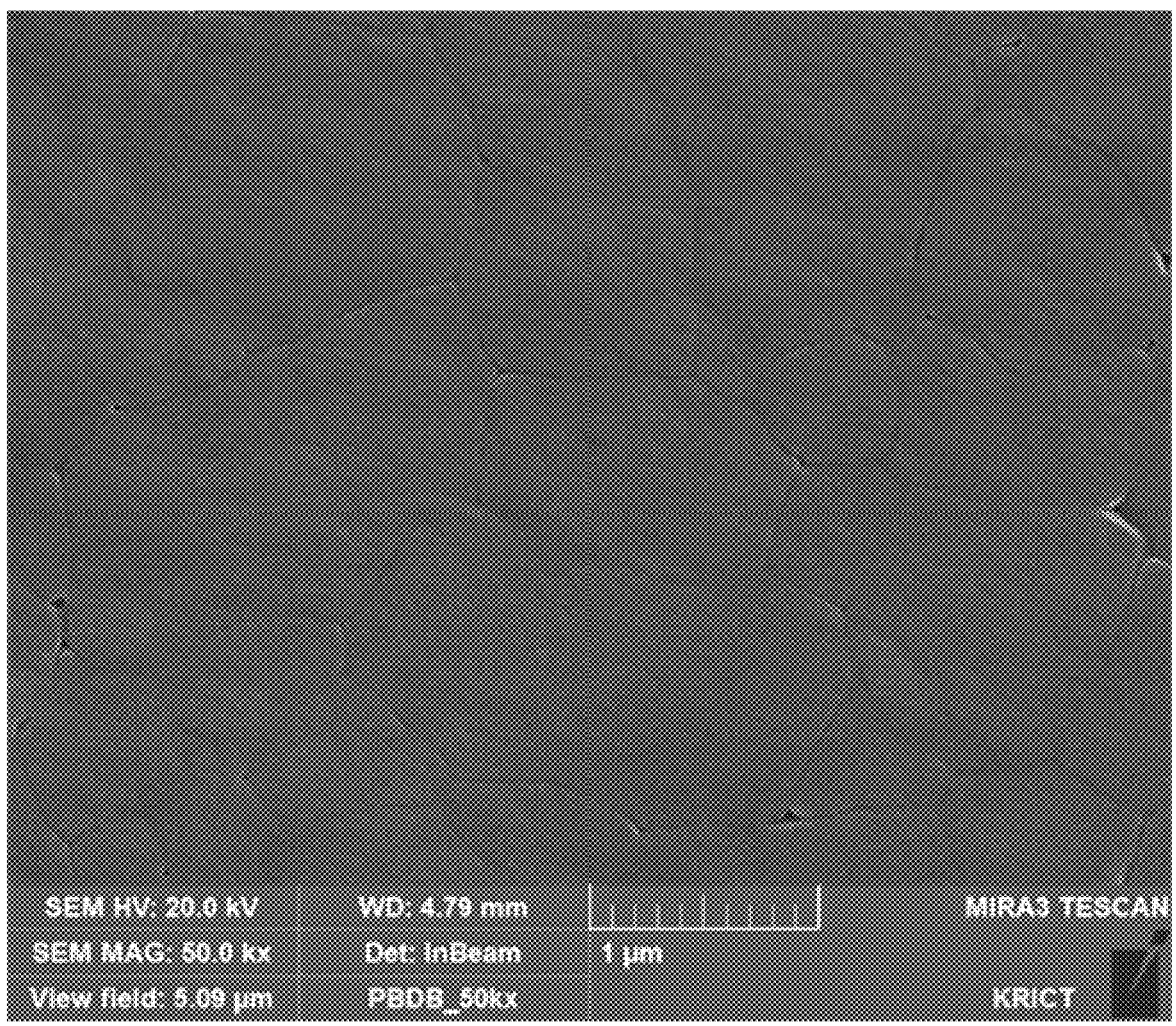
FIG. 5 is a scanning electron microscope (SEM) image of a surface of a perovskite compound film (after annealing) prepared in Example 3.

FIG. 5 is a scanning electron microscope (SEM) image of the surface of the annealed $MAPbI_3$ perovskite compound film. It could be appreciated that a large grain size of a micrometer level was formed compared to the thin film obtained in Comparative Example 3 shown below, and that an extremely flat surface was maintained. This highly crystalline high quality thin film is very advantageous for a photoelectric conversion device such as a solar cell or a light emitting diode.

It was confirmed that the perovskite thin film prepared in Example 3 had a root mean square (rms) surface roughness of 3.6 nm, and merely had the maximum peak height (Rp) of 5.3 nm, which were measured by using an atomic force microscopy (AFM).

Comparative Example 3

A solar cell was produced in the same manner as in Example 2. However, in the production of the solar cell, a perovskite compound film was formed in the same manner as in Comparative Example 1 in the step in which the perovskite compound film was formed after the porous electron transport layer was formed, except that a 200 mM concentration of $CH_3NH_3I$ (hereinafter, MAI) isopropanol solution was used instead of using the 250 mM concentration of $CH(NH_2)_2I$ isopropanol solution in Comparative Example 1, followed by heat-treatment at 1000 instead of using 150° C., thereby forming a $CH_3NH_3PbI_3$ (hereinafter, referred to as $MAPbI_3$) perovskite compound film.

Figure 6:
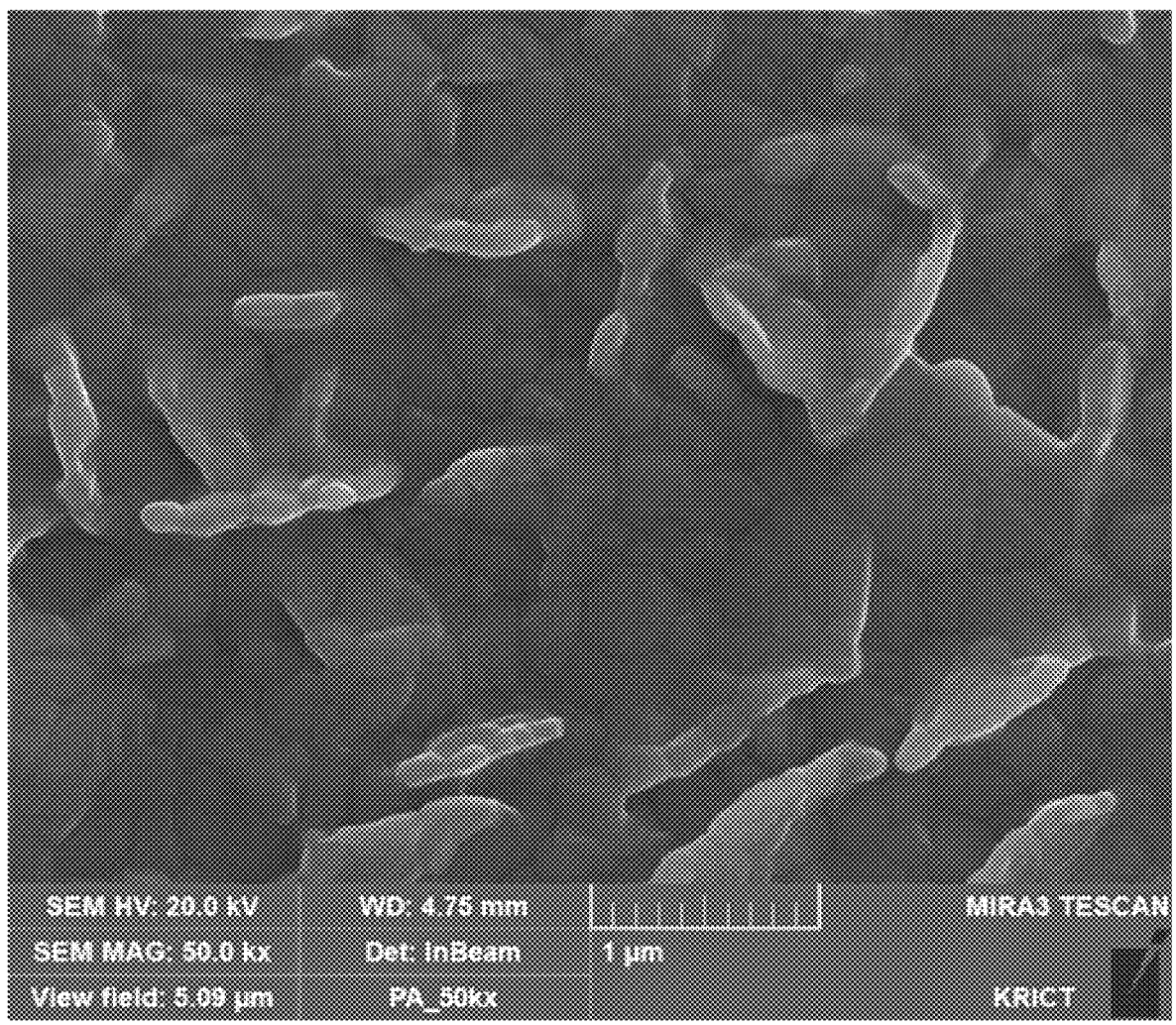
FIG. 6 is a scanning electron microscope (SEM) image of a surface of a perovskite compound film prepared in Comparative Example 3.

A scanning electron microscope (SEM) image of the surface of the thin film formed in Comparative Example 3 was shown in FIG. 6.

As shown in FIG. 6, it could be appreciated that the $MAPbI_3$ perovskite thin film prepared by Comparative Example 3 had a large surface roughness and was composed of fine crystal grains having a size of 100 to 300 nm. This is a completely different form from the $MAPbI_3$ perovskite thin film prepared in Example 3 observed in FIG. 5. It could be appreciated that the perovskite compound film converted from the precursor film through the mutual molecular exchange crystallization method provided in the present invention exhibited a remarkably flatter shape than the perovskite compound film prepared by reaction from the conventional $PbI_2$ film, and showed coarse crystal grains.

The perovskite thin film prepared in Comparative Example 3 had a root mean square (rms) surface roughness of 32.1 nm, and the maximum peak height (Rp) of 45.6 nm, which were measured by using an atomic force microscopy (AFM), and thus, it could be appreciated that a thin film having a very rough surface was prepared in Comparative Example 3. It could be appreciated that the perovskite compound film prepared according to an embodiment of the present invention was extremely flat.

Photoelectric conversion characteristics of the solar cells produced in Examples 2 and 3 and Comparative Examples 2 and 3 were measured under the conditions of AM 1.5 (100 mA/cm$^2$), and results thereof were summarized in Table 2.

TABLE 2

| | Jsc (mA/cm$^2$) | Voc (V) | FF (%) | PCE (%) |
|---|---|---|---|---|
| Example 2 | 24.7 | 1.07 | 79 | 20.8 |
| Comparative Example 2 | 22.0 | 1.03 | 67 | 15.2 |
| Example 3 | 22.5 | 1.15 | 78 | 20.1 |
| Comparative Example 3 | 21.2 | 1.05 | 65 | 14.4 |

It could be appreciated that the $FAPbI_3$ perovskite compound film prepared in Example 2 was crystallized into the perovskite compound through the mutual molecular exchange crystallization from the $PbI_2$(DMSO) precursor film as described above, and thus, a high-quality thin film having [111] preferred orientation property and composed of large crystal grains was well formed without the secondary phase such as residual $PbI_2$. Accordingly, it could be appreciated that the solar cell of Example 2 had higher Jsc, Voc and FE values than those of the $FAPbI_3$ solar cell produced in Comparative Example 2.

The $MAPbI_3$ perovskite compound film prepared in Example 3 had a thin film form including several micro-sized large crystal grains, which is a highly flat, high-quality perovskite compound film as compared to that of Comparative Example 3. Therefore, the solar cell produced in Example 3 had more excellent Jsc, Voc and FF values, and exhibited excellent photoelectric conversion efficiency (PCE). That is, it could be appreciated that the solar cell had an extremely high efficiency by the light absorber structure of the perovskite compound film in a highly planarized thin film form including large crystal grains.

Example 4

A perovskite solar cell of $(FA_{0.85}MA_{0.15})Pb(I_{0.85}Br_{0.15})_3$ was produced in the same manner as in Example 2 except that the composition of $FAPbI_3$ was controlled. When practicing the method of Preparation Example 1 to prepare the perovskite having this composition, a $PbI_2$—$PbBr_2$-DMSO precursor material was prepared by adding 15 mol % of $PbBr_2$ (lead bromide, 99%), and used. In detail, in Preparation Example 1, a 0.8 M (molar concentration based on Pb) $PbI_2$—$PbBr_2$-DMSO solution was prepared by stirring $PbI_2$ and $PbBr_2$ having a molar ratio of 0.85:0.15 in a dimethylsulfoxide (hereinafter, referred to as DMSO) solvent at 60V for 2 hours. Precipitate powder formed by adding drop-wise this solution to toluene was separated and recovered by a filter paper, and dried in a room-temperature vacuum oven for 6 hours, and further dried in 60° C. vacuum oven for 24 hours to prepare $(PbI_2)_{0.83}(PbBr_2)_{0.10}(DMSO)$. In addition, when the perovskite thin film was prepared, the method of Example 2 was performed by using a solution containing $CH(NH_2)_2I(FAI)$ and $CH_3NH_3Br$ (hereinafter, referred to as MABr) having a molar ratio of 0.85:0.15 instead of using the $CH(NH_2)_2I(FAI)$ isopropanol solution. The solar cell produced in Example 4 had a Jsc value of 23.2 mA/cm$^2$, a Voc value of 1.18 V, and an FF value of 80%, thereby exhibiting a high photoelectric conversion efficiency (PCE) value of 21.9%.

Example 5

A solar cell was produced by preparing the $MAPbI_3$ light absorber film in the same manner as in Example 3. However, in the formation of the perovskite compound film by reacting with MAI, a $PbI_2$—HI adduct film instead of the $PbI_2$-DMSO adduct, was formed and used as a precursor film. The $PbI_2$—HI adduct film was prepared as follows.

$PbI_2$ powder (lead iodide, 99%) purchased from Sigma-Aldrich Co., was stirred in a DMF solvent at 60° C. for 2 hours to prepare a 1.0 M $PbI_2$-DMF solution. A hydriodic acid (HI) solution purchased from Sigma-Aldrich Co., was added to this solution, thereby preparing a $PbI_2$—HI solution, wherein the HI solution had the same amount as that of $PbI_2$. This $PbI_2$—HI solution was spin-coated on the porous $TiO_2$ substrate prepared in the same manner as in Example 2 at 3000 rpm for 150 seconds, thereby forming a $PbI_2$—HI adduct film. In the XRD analysis result of the obtained $PbI_2$—HI adduct film, a diffraction peak in which a 2θ value is strong at a low angle of 10° or less was observed, which was like the PbI$_2$-DMSO adduct film. From the observation, could be confirmed that the PbI$_2$—HI adduct film is also a crystal phase precursor film having a long-range ordering.

The thus-formed PbI$_2$—HI precursor film and the MAI solution were reacted as in Example 3 to prepare a MAPbI$_3$ perovskite film and to produce a solar cell. The solar cell produced in Example 5 had a Jsc value of 23.0 mA/cm$^2$, a Voc value of 1.16 V, and an FF value of 78%, thereby exhibiting a high photoelectric conversion efficiency (PCE) value of 20.8%.

Example 6

A solar cell was produced by preparing the FAPbI$_3$ light absorber film in the same manner as in Example 2. However, in the formation of the precursor film of the PbI$_2$-DMSO adduct, DMSO was directly added to the PbI$_2$ solution to prepare a solution without preparing the PbI$_2$(DMSO) precursor material in advance as in the preparation method of the precursor film in Example 1, thereby preparing the precursor film. In detail, PbI$_2$ powder (lead iodide, 99%) purchased from Sigma-Aldrich Co., was stirred in N,N-dimethylformamide (DMF) solvent at 60° C. for 1 hour to prepare a 1.5 M PbI$_2$-DMF solution. The prepared PbI$_2$-DMF solution had a concentration state in which PbI$_2$ is not completely dissolved, in consideration of solubility of PbI$_2$. However, dimethylsulfoxide (DMSO) having the same amount as PbI$_2$ was added to this solution, and further stirred at 60° C. for 1 hour, and thus, a transparent PbI$_2$-DMSO DMF solution was able to be prepared. This PbI$_2$-DMSO DMF solution was spin-coated on the porous TiO$_2$ substrate prepared in the same manner as in Example 2 at 3000 rpm for 30 seconds, thereby forming a PbI$_2$(DMSO) adduct film. In the XRD analysis result of the obtained PbI$_2$(DMSO) adduct film, a diffraction peak in which a 2θ value was present at a low angle around 10°, was observed, which was like the PbI$_2$-DMSO adduct film prepared in Example 1, and it was confirmed that this result coincided with the diffraction pattern of the PbI$_2$(DMSO) crystal phase of FIG. 1. It could be confirmed from this result that a film prepared by directly adding DMSO to the PbI$_2$-DMF solution was also a PbI$_2$(DMSO) precursor film.

The thus-formed PbI$_2$(DMSO) precursor film and the FAI solution were reacted as in Example 2 to prepare a FAPbI$_3$ perovskite film and to produce a solar cell. The solar cell produced in Example 6 had a Jsc value of 23.9 mA/cm$^2$, a Voc value of 1.06 V, and an FF value of 77%, thereby exhibiting a high photoelectric conversion efficiency (PCE) value of 19.5%.

Hereinabove, although the present invention is described by specific matters, limited exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the claims to be described below as well as all modified equally or equivalently to the claims are intended to fall within the scopes and spirit of the present invention.

The invention claimed is:

1. A method for preparing an inorganic/organic hybrid perovskite compound film comprising:
   a) forming a precursor film containing an adduct of halogenated metal and guest molecule on a substrate layer;
   b) reacting the precursor film with an organic halide to prepare an inorganic/organic hybrid perovskite compound film; and
   c) annealing the precursor film that reacted with the organic halide, wherein the quest molecule is a material satisfying the following Relational Equation 1:

$$0 \leq \frac{|t_p - t_0|}{t_0} \leq 0.2 \qquad \text{(Relational Equation 1)}$$

in Relational Equation 1, $t_0$ is a thickness of the precursor film, and $t_p$ is a thickness of the inorganic/organic hybrid perovskite compound film formed from the precursor film.

2. The method of claim 1, wherein in step b), the precursor film is converted to the inorganic/organic hybrid perovskite compound film, by an intramolecular exchange reaction between the guest molecule contained in the precursor film and the organic halide.

3. The method of claim 1, wherein the guest molecule is a solvent that dissolves the halogenated metal of the adduct of halogenated metal and guest molecule, or a hydrogen halide.

4. The method of claim 1, wherein step a) includes applying a first solution containing the adduct of halogenated metal and guest molecule, or a second solution containing a halogenated metal and a guest molecule to the substrate layer.

5. The method of claim 1, wherein step b) includes applying a third solution containing the organic halide onto the precursor film.

6. The method of claim 1, wherein the adduct of halogenated metal and guest molecule is represented by Chemical Formula 1 below:

$$MX_2(GM)_n \qquad \text{(Chemical Formula 1)}$$

in Chemical Formula 1, M is a divalent metal cation, X is one or two or more halogen anions selected from Cl$^-$, Br$^-$, F$^-$, and I$^-$, GM is dimethylsulfoxide (DMSO) as a guest molecule, and n is a real number of 0.5 to 50.

7. The method of claim 1, wherein the substrate layer includes a charge transport layer which is an electron transport layer or a hole transport layer, the charge transport layer having a porous structure or a dense structure.

8. The method of claim 1, wherein the organic halide satisfies the following Chemical Formula 2:

$$AX \qquad \text{(Chemical Formula 2)}$$

in Chemical Formula 2, A is one or two organic cations selected from ammonium group cations and amidinium group cations, and X is one or two or more halogen anions selected from Cl$^-$, Br$^-$, F$^-$, and I$^-$.

9. A method for preparing an inorganic/organic hybrid perovskite compound film comprising:
   a) forming a precursor film containing an adduct of halogenated metal and guest molecule on a substrate layer; and
   b) reacting the precursor film with an organic halide to prepare an inorganic/organic hybrid perovskite compound film, wherein the guest molecule is a material satisfying the following Relational Equation 1:

$$0 \leq \frac{|t_p - t_0|}{t_0} \leq 0.2 \qquad \text{(Relational Equation 1)}$$

in Relational Equation 1, to is a thickness of the precursor film, and $t_p$ is a thickness of the inorganic/organic hybrid perovskite compound film formed from the precursor film.

* * * * *